US006536024B1

(12) United States Patent
Hathaway

(10) Patent No.: US 6,536,024 B1
(45) Date of Patent: Mar. 18, 2003

(54) METHOD FOR MAKING INTEGRATED CIRCUITS HAVING GATED CLOCK TREES

(75) Inventor: David J. Hathaway, Underhill Center, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/617,908

(22) Filed: Jul. 14, 2000

(51) Int. Cl.$^7$ .............................................. G06F 17/50
(52) U.S. Cl. ...................... 716/6; 716/2; 716/5; 716/7; 716/8
(58) Field of Search ........................ 716/1–21; 375/356; 327/295; 257/208

(56) References Cited

U.S. PATENT DOCUMENTS

| 4,615,005 | A |   | 9/1986  | Maejima et al. ............ 364/200 |
|-----------|---|---|---------|------------------------------------|
| 5,452,239 | A |   | 9/1995  | Dai et al. .................... 364/578 |
| 5,615,376 | A |   | 3/1997  | Ranganathan ............... 395/750 |
| 5,701,441 | A |   | 12/1997 | Trimberger ................. 395/500 |
| 5,715,172 | A |   | 2/1998  | Tzeng ........................ 364/490 |
| 5,801,955 | A |   | 9/1998  | Burgun et al. .............. 364/489 |
| 5,866,924 | A | * | 2/1999  | Zhu ............................ 257/208 |
| 6,020,774 | A | * | 2/2000  | Chiu et al. .................. 327/295 |
| 6,173,435 | B1| * | 1/2001  | Dupenloup ................. 716/18 |
| 6,204,713 | B1| * | 3/2001  | Adams et al. .............. 327/295 |
| 6,229,861 | B1| * | 5/2001  | Young ........................ 375/356 |
| 6,286,128 | B1| * | 9/2001  | Pileggi et al. ................ 716/18 |
| 6,298,468 | B1| * | 10/2001 | Zhen ............................. 716/2 |

OTHER PUBLICATIONS

Carrig et al, "A Clock Methodology for High–Performance Microprocessors," IEEE, May 1997, pp. 119–122.*
Chelcea et al, "A Low–Latency Fifo for Mixed–Clock Systems," IEEE, Apr. 2000, pp. 1–8.*

* cited by examiner

*Primary Examiner*—Vuthe Siek
(74) *Attorney, Agent, or Firm*—Schmeiser, Olsen & Watts; Richard M. Kotulak

(57) ABSTRACT

A method for synthesizing a logic circuit that is driven by a clock signal, and that has a plurality of clock domains each having a plurality of clock sinks. A semiconductor substrate is provided. All of the plurality of clock sinks of one clock domain are placed into at least one cluster of clock sinks on the semiconductor substrate. A clock sink-density of each cluster of clock sinks is approximately equal to or greater than a clock sink density of an integrated circuit. A first portion of the plurality of clock sinks of a domain have a higher sink density than a second portion of the plurality of clock sinks of the same domain. The first portion has a subregion and the second portion has a subregion. The subregion of the first portion is adjacent to the region of the second portion.

29 Claims, 29 Drawing Sheets

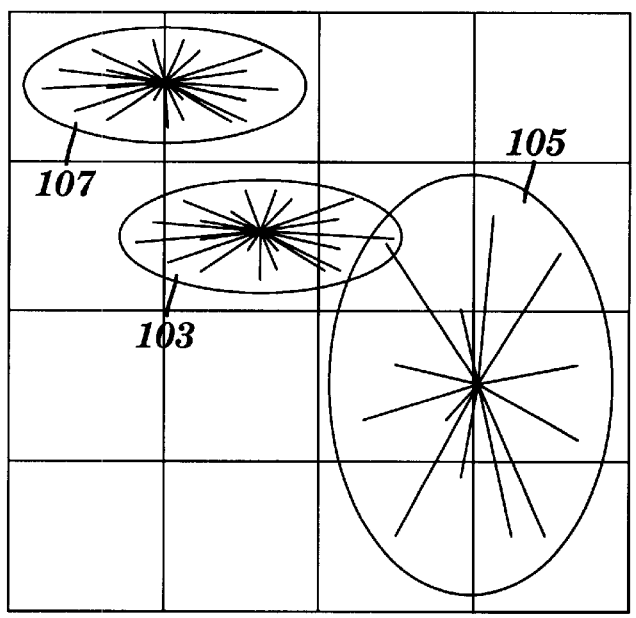
FIG. 2a-i
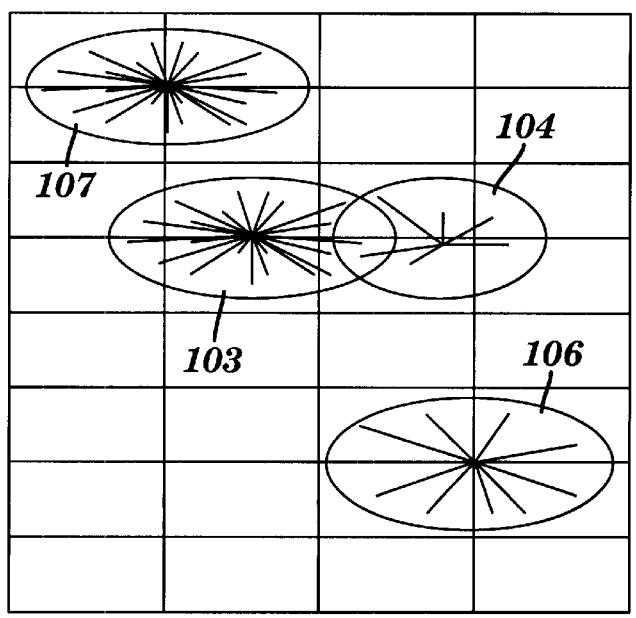
FIG. 2a-ii

ClockGate Analysis
                                                   ← 601

603 {
Calculated number of clockgates: 3
57 Vectors analyzed
Writing activity file clock_groups.aet ClockGate Report

|  |  |  | Usefullness |
|---|---|---|---|
| Clock | Activity | %Latches | ((1-activity) * (%Latches*100)) |
| CLKG_A | 0.316 | 0.40 | 27.4 |
| CLKG_B | 0.316 | 0.50 | 34.2 |
| CLKG_C | 0.947 | 0.10 | 0.5 |

605

Useless CLOCKGATES as defined by threshold: 5

Signal CLKG_C has a usefullness metric of 0.5

Writing Correlation File clock_groups.cor

Correlated CLOCKGATE Groups at threshold: 0.9

GROUP 1 Correlation=

CLKG_A : activity 0.316

CLKG_B : activity 0.316

CLOCK_GROUPS.COR file

607 {

\# Signal Correlation Report

|  | C L K G ‾A | C L K G ‾B | C L K G ‾C |
|---|---|---|---|
| CLKG_A | 1.00 | 0.95 | 0.37 |
| CLKG_B | 0.95 | 1.00 | 0.37 |
| CLKG_C | 0.37 | 0.37 | 1.00 |

METHOD FOR MAKING INTEGRATED CIRCUITS HAVING GATED CLOCK TREES

FIELD OF THE INVENTION

The present invention relates to the design of integrated circuits having clock signal distribution networks (clock trees) and clock gating circuitry, and more particularly to methods for making energy efficient integrated circuits (IC) with gated clock trees.

BACKGROUND OF THE INVENTION

Typical integrated circuit (IC) chips may contain hundreds of thousands or millions of transistor elements, plus wires and other elements such as resistors and capacitors to implement their logical functions. Additionally, an IC chip may contain a "clock tree" or "clock net," comprising a network of wires and buffers and clock gating elements, that distributes and/or restricts the "clock signal" that controls the timing and operation of portions of the logical elements of the IC. When designing integrated circuits, a netlist description (model) of the integrated circuit is generated. The netlist includes a description of the integrated circuit's logical components and the connections or networks ("nets") between the components. The components include all those circuit elements necessary for implementing the logic circuit, such as combinational logic (e.g. gates) and sequential logic (e.g., flip-flops and latches). The logic elements and other circuits controlled by a clock signal such that they add capacitance to the clock tree are generally referred to herein as "clock sinks" or "sinks." The sequential logic elements (i.e., sinks), such as flip-flops, RAMs, dynamic logic gates, and latches, that are "clocked" by the clock structure of the circuit are usually described in the netlist, although their connections with the clock tree are usually omitted from the netlist during placement in the related art. The netlist descriptions of the related art generally do not include a description of the clock tree components, connections or nets for logic circuit placement decision purposes. The physical design process of integrated circuits has been traditionally performed in three separate operations: logic placement; clock tree optimization; and wiring. Traditionally, placement is the assignment of logic circuits in the netlist to locations (called "cells" or "bins"), on the chip image. Traditionally, the connections within clock trees, such as clock signal connections to clock buffers, clock gates, and clock sinks are only "optimized after placement" of the logic circuits has been completed. See, e.g., CIRCUIT PLACEMENT, CHIP OPTIMIZATION, AND WIRE ROUTING FOR IBM IC TECHNOLOGY, IBM Journal of Research and Development, (Volume 40, Number 4, July 1996). Wiring is the generation of routes between circuit elements, using the available interconnection layers, to complete the connections specified in the final netlist.

The clock signal is the most fundamental control signal in a digital circuit, and is usually required to be transmitted to all regions of the IC chip that it controls. Buffers are generally used in the clock signal distribution tree to amplify and retransmit the clock signal where long thin wires spanning the IC chip would otherwise tend to slow or attenuate the propagation of the clock signal. As the rapidly developing field of low power integrated circuitry advances, the number of transistor logic elements per unit of chip surface area continues to increase. As the integrated circuit density on a chip increases, the amount of power consumed and heat generated per unit of area by the integrated circuits on the substrate increases proportionally. The integrated circuit industry has changed from TTL to Complimentary Metal Oxide Semiconductor (CMOS) technology in order to decrease the current consumption, thereby reducing power consumption and heat generation. CMOS logic circuits consume power when they are switched between logical states, such as by a clock signal. The power consumption of CMOS elements decreases in proportion with a decrease in switching frequency.

In typical Integrated Circuit (IC) designs, e.g., Application Specific Integrated Circuit (ASIC) or microprocessor designs, the clock signal distribution network or "clock tree" of the related art can consume from 20% to 80% of an integrated circuit's total active power. As the clock signal and its related circuitry may be a large power consuming factor within most microprocessor systems, one important technique for reducing power consumption in microprocessor designs is to reduce the power consumption of a microprocessor's clock signal distribution network (e.g., "tree") by splitting the clock signal into several separate clock signals that can be individually disabled or "gated off" when the logical portion (e.g., "domain") of the circuit it controls does not need to be clocked. The logical portion of the circuit that is controlled by the clock signal that is gated off by a particular clock gating signal is called a "clock gate domain" or "domain."

The process known as "clock gating", disables the clock signals fed to logic blocks (i.e., "domains") of the circuit when the logic blocks (i.e., domains) are not currently in use by the circuit (e.g., microprocessor). Without clock-gating, power is consumed by every sink during every clock cycle. Power consumption due to the clocking of logic blocks that are not directly involved with the current operation of the microprocessor may be reduced by clock gating. Clock gating techniques of the related art require additional logic (e.g., clock gating logic) circuitry to generate the clock gating signals and also gates within the clock tree to gate the clock signal in each domain.

If a plurality of logically non-equivalent gated clock domains overlap the same physical region of the chip, the total clock tree capacitance can increase substantially, due to the overlapping and separate clock-gating circuitry and domain wiring. This increased capacitance can increase power consumption so much that any reduction due to clock gating is cancelled out. Conversely, if the sinks gated by a particular gated clock signal are forced into an exclusive physical region not overlapping any region occupied by the sinks controlled by other gated clocks, clock tree capacitance may be reduced, but significant skew, delay or wireability problems may be created.

In order to have a power savings, the clock gating logic circuitry must consume less power than is saved by gating the clock signals off. Therefore, net reduction of power consumption by clock gating is a balancing function of the power consumed by the added clock gating circuitry and wires and the power that would be consumed by leaving a domain or a subdomain (i.e., a portion of a domain) of the clock tree either ungated or less than maximally gated.

Strategies for defining logic blocks (i.e., "clock gate domains") that can be clock-gated and strategies for identifying and/or generating the clock gating control signals that perform the clock gating are known to persons skilled in the art. The ideal clock signal distribution tree has the smallest number of clock gates that yield the maximum amount of clock gating power savings when running typical application code. The degree of optimization of clock distribution trees is generally limited in the related art by the constraints imposed by logic circuit placement that has been completed without regard for clock tree optimization considerations.

Traditionally, the connections and nets within the clock tree have been zero-weighted or omitted in models and/or placement netlists so that those connections and nets do not influence the placement of clock sinks or other logic circuits. Traditionally, clock optimization tools are employed only after placement, to perform optimization of clock tree nets, such as by gating the nets of domains and/or subdomains, interchanging sinks of equivalent nets, creating and moving parallel copies of clock buffers and/or gates, adding load circuits to balance clock net loads, and generating balanced clock tree routes. In general, the clock-gating strategies of the related art attempt to optimize clock tree structures by intelligently distributing clock gates, wires, and buffers only after the clock tree topology has been constrained by the placement of the clock-controlled logic circuits without regard for clock tree efficiency concerns. After placement, the strategies of the related art make modifications to the number and arrangement clock signal buffers, of clock signal splitters, of clock signal gates and other clock tree elements, modifications to the connections between these clock net elements, and modificatons to the location of these connections and elements. The goals of these after-placement clock tree optimizations include to reduce the total length of connections (wire) in the clock tree and to reduce or control the skew between the clock arrival times at various clock tree sinks. The problems of this after-placement approach include that the power savings to be obtained through clock-gating is arbitrarily and non-optimally limited by the relatively random distribution of sinks of each clock gate domain across the whole chip.

At the other extreme, U.S. Pat. No. 6,020,774 to Chiu, teaches a method "of synthesizing a gate array logic circuit," (a very simple ASIC circuit), to minimize the power consumption of its clock tree by forcing (i.e., "grouping") all logic elements (e.g., latches) controlled by one gated clock signal (e.g., of one clock gate domain) into exclusive physical regions on the chip. This simplistic forcing method for optimizing "gate array logic circuits," taught by 6,020,774, is not practical for use in Large Scale Integrated (LSI) circuits and Very Large Scale Integrated (VLSI) circuits where significant distances may need to be spanned to communicate signals between two or more logic elements of two or more clock gate domains, or where the clock-gating control signal of one domain-region is generated by logic circuitry located in another domain-region. Forcing all sinks (e.g., logic elements) that are clock-gated alike (e.g., in the same domain) into exclusive physical proximity (i.e., "together as a collective unit" as in the method of 6,020,774,) without regard for the impact on wiring overhead of connections outside the clock tree itself is very likely to create or aggravate skew, delay, and/or wiring problems in Large Scale Integrated (LSI) circuits or VLSI circuits, and may result in inoperable or unreliable circuits.

In certain integrated circuits, clustering a domain's sinks while ignoring the layout of clock-gating logic connections and/or connections between clock-controlled logic in different clock domains can generate a wiring overhead that consumes more power than is gained by an optimized clock gating strategy.

Accordingly, a need exists for methods to reduce the power consumption of integrated circuits through clock power optimizing logic circuit placement without introducing or aggravating skew, delay, and/or wiring problems outside of the gated clock tree itself.

SUMMARY OF THE INVENTION

To overcome the deficiencies of the related art, a first aspect of the invention provides a method for synthesizing a logic circuit that is driven by a clock signal, and that has a plurality of clock domains each having a plurality of clock sinks, the method for synthesizing a logic circuit that is driven by a clock signal, and that has a plurality of clock domains each having a plurality of clock sinks, the method comprising:

providing a semiconductor substrate;

placing all of the plurality of clock sinks of one domain into at least one cluster of clock sinks on the semiconductor substrate, wherein the sink-density of each cluster of clock sinks is approximately equal to or greater than the clock sink density of the integrated circuit.

A second aspect of the invention provides an integrated circuit, that is driven by a clock signal, comprising:

a semiconductor substrate; and a plurality of clock domains each having a plurality of clock sinks;

wherein the plurality of clock sinks of one domain forms at least one cluster of clock sinks on the semiconductor substrate, wherein the sink-density of each cluster of clock sinks is approximately equal to or greater than the clock sink density of the integrated circuit.

A third aspect of the invention provides a method for creating an integrated circuit having a clock signal distributed by a gated clock tree having a plurality of clock domains each having a plurality of clock sinks, comprising the steps of:

creating a model of the integrated circuit, wherein the model includes a netlist;

establishing at least one target condition for a domain before placement is completed;

making a determination of the extent to which a domain is in compliance with the target condition; and making a placement refinement based upon the determination.

A fourth aspect of the invention provides a method for creating an integrated circuit, comprising the steps of:

providing a logic circuit design;

providing a clock tree design having clock sinks in common with the logic circuit design;

defining the clock gate domains of the clock tree optimally for power efficiency based upon physical placement information prior to completion of placement; and optimizing the logic circuit and the gated clock tree together during placement.

A fifth aspect of the invention provides a method for creating an integrated circuit, comprising the steps of:

providing a semiconductor substrate;

providing a logic circuit design;

providing a clock tree design having clock sinks in common with the logic circuit design;

performing a placement refinement providing information about the location of the clock sinks on the substrate; and performing an after-placement-type clock tree optimization method before placement is complete.

The first, third, fourth, fifth method aspects of the invention may be combined or performed separately and/or individually.

A computer program product also is provided having a computer readable medium with program code for performing the first, third, fourth, fifth method aspects, and for producing the chip of the second aspect of the invention. The inventive program product is carried by a medium readable by a computer (e.g., a carrier wave signal, a floppy disc, a hard drive, a CD-ROM, a random access memory, etc.). The computer readable medium comprises program code for performing the first, third and/or fourth aspects of the invention. An embodiment of the invention in a computer readable medium having:

program code for creating a model of the integrated circuit, wherein the model includes a netlist;

program code for establishing at least one target condition for a domain before placement is completed;

program code for making a determination of the extent to which a domain is in compliance with the target condition;

program code for making a placement refinement based upon the determination.

Other features of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements.

Additionally, the left-most digit of a reference number identifies the drawing in which the reference number first appears.

FIG. 2a-i is a diagram depicting a reduced-capacitance clustered physical placement of clock sinks on a chip of the clock-gated integrated circuit design of FIG. 1a in accordance with an embodiment of the present invention;

FIG. 2a-ii is a diagram depicting a further reduced-capacitance physical placement of clock sinks on a semiconductor chip, wherein a domain of relatively low sink-density has been split into two separated clustered subdomains on a chip, each subdomain having a higher sink-density than the corresponding low sink-density domain depicted in FIG. 2a-i, in accordance with an embodiment of the present invention;

FIG. 2b is a flow diagram depicting an embodiment of the inventive method for optimized placement of clock sinks and logic circuitry wherein all of the sinks of each domain are placed into one or more clusters on the chip as depicted in FIG. 2a-i and FIG. 2a-ii.

FIG. 2c is an exemplary timing diagram for the various clocking waveforms possibly found in the integrated circuit design of FIG. 1a;

FIG. 2d is a diagram depicting a subdomain of one domain nested within another domain on a chip, in accordance with an embodiment of the present invention;

FIG. 2e is a diagram depicting a merger of the subdomain from one domain with another domain on a chip, in accordance with an embodiment of the present invention;

FIG. 2f is a simplified schematic diagram of an exemplary real clock tree, wherein gates are arranged to provide single-point gating and wherein a multiplicity of levels of gates and buffers are employed to drive and fan out the gated clock signals to all the sinks of all domains;

FIG. 2g is a simplified schematic diagram of an exemplary model of a skeleton clock tree, wherein a single copy of each equivalent gate is provided at the appropriate level to effect single-point gating of all the sinks of all domains, and wherein there is only a single copy of each equivalent buffer on each level.

FIG. 6 is an exemplary clock gating report generated by the clock gating methodology of FIG. 4 based on the microprocessor design of FIG. 1a;

FIG. 9 is a schematic diagram of a clock tree of a circuit created using the method of the related art depicted in FIG. 1b, that represents an improvement of the clock tree of FIG. 8a;

DETAILED DESCRIPTION OF THE INVENTION

Figure 1A:
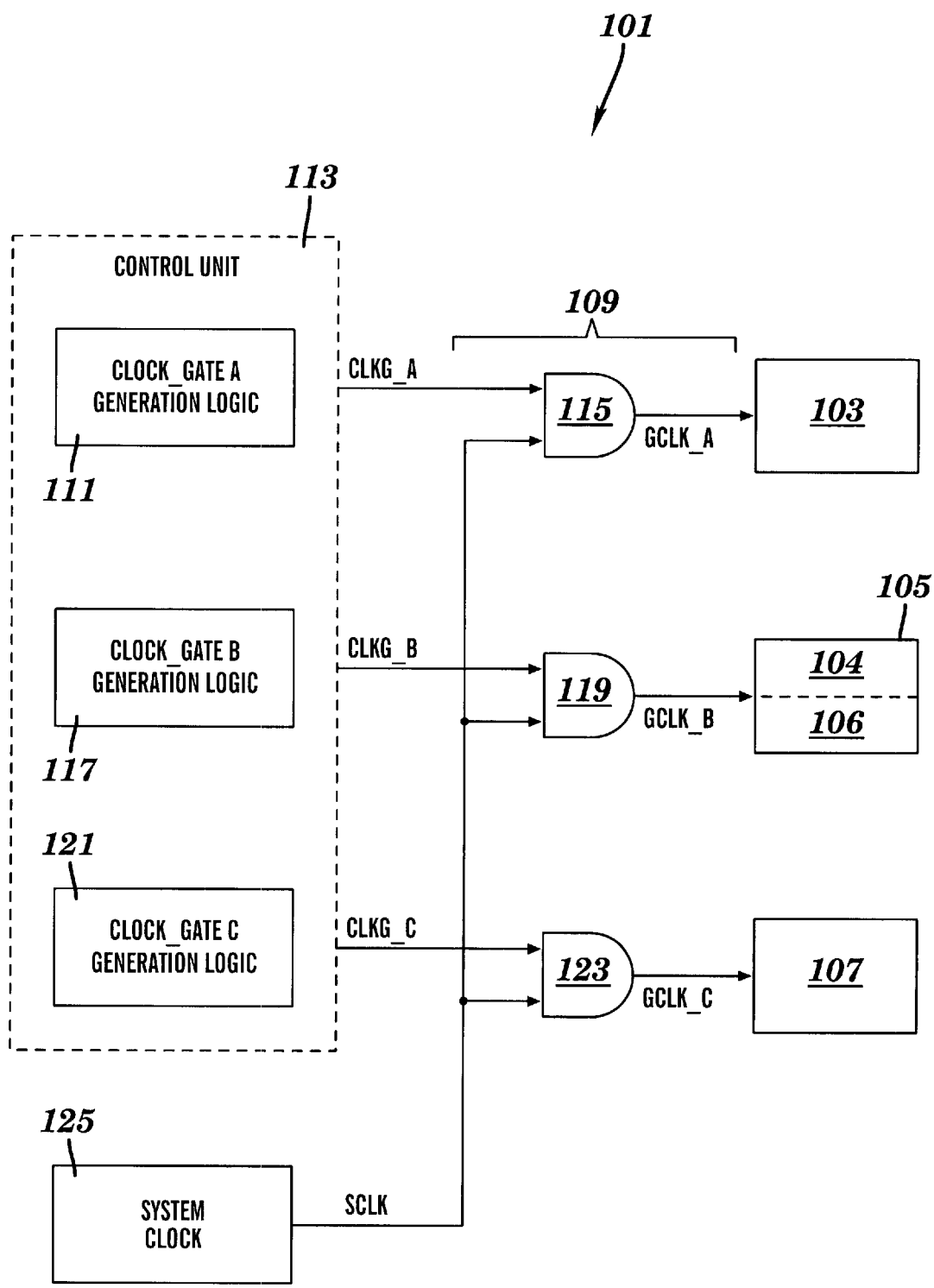
FIG. 1a is a simplified schematic diagram of an exemplary gated-clock integrated circuit design of the related art.

FIG. 1a is a schematic diagram of an exemplary clock-gated integrated circuit (e.g., ASIC or microprocessor) design 101. The integrated circuit design 101 comprises three logic circuitry blocks (i.e., domains) 103, 105, 107 respectively controlled by three differently gated clock signals via a clock signal distribution network (i.e., clock tree) 109. Domain 105 illustrates that subdomains e.g., 104 and 106, are subsets of the logic circuitry of their parent domain, e.g., 105, and are controlled by the same clock gate 119 and by the same gated clock signal GCLK_B. The clock signal distribution network 109 comprises wires carrying signals, and gates (115, 119, 123) for gating the clock signal (SCLK) from the system clock 125. A first set of clock gating signal generation logic 111 (referred to as "control unit logic" in microprocessor design where all such logic sets 111, 117, and 121 may be contained within a centralized "control unit" 113) is operatively coupled to a first AND gate 115 and to the first logic block (i.e., domain) 103. A second set of clock gating signal generation logic 117 is operatively coupled to a second AND gate 119 and to the second domain 105. A third set of clock gating signal generation logic 121 is operatively coupled to a third AND gate 123 and to the third domain 107. The first, second and third AND gates 115, 119 and 123 also are operatively coupled to a system clock 125 of the integrated circuit design 101 and to the domains 103, 105, 107 as shown.

A real clock signal distribution network (i.e., clock tree) design will include a multiplicity of levels each comprising an increasing number (e.g., increasing approximately exponentially each level according to the fanout) of buffers and gates as one moves from the root (at the clock signal source 125) to the leaves (at the clock sinks with each domain 103, 105, 107). Such a real clock tree structure is depicted in simplified form in FIG. 2f.

In operation, the system clock 125 supplies a system clock signal (SCLK) to the first, second and third AND gates 115, 119 and 123. To minimize power consumption of the domain 103, the first set of control unit logic 111 supplies a first clock gating signal (CLKG_A) to the first AND gate 115 that gates the system clock signal (SCLK) when the first logic block 103 is not in use. A first gated clock signal (GCLK_A) thereby is produced that clocks the clock sinks of the first domain 103 and that is individually controllable via the first set of control unit logic 111. Similarly, to minimize power consumption of the logic blocks (domains) 105–107, the second set of control unit logic 117 supplies the second AND gate 119 a second clock gating signal (CLKG_B) that gates the system clock signal (SCLK) when the second logic block 105 is not in use, and the third set of control unit logic 121 supplies the third AND gate 123 a third clock gating signal (CLKG_C) that gates the system clock signal (SCLK) when the third logic block 107 is not in use. A second gated clock signal (GCLK_B) and a third gated clock signal (GCLK_C) thereby are produced that clock the second logic block 105 and the third logic block 107, respectively, and that are individually controllable.

Figure 1B:
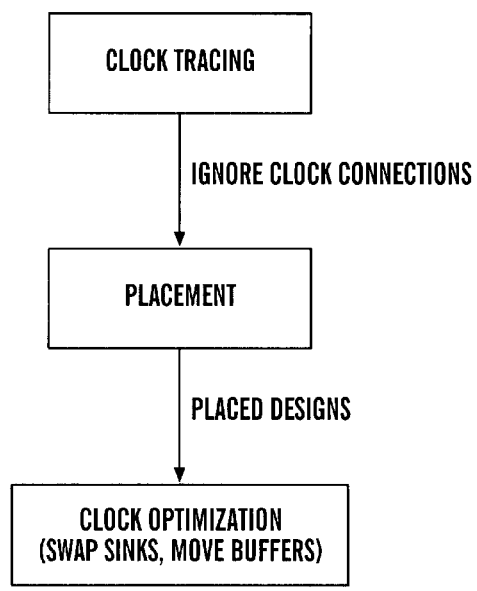
FIG. 1b is a flow-diagram depicting the typical "optimize after placement" methodology of the related art.

FIG. 1b is a flow-diagram depicting the typical "optimize after placement" methodology of the related art. FIG. 1b is to be contrasted with an embodiment of the inventive placement method depicted in FIG. 2b.

Figure 1C:
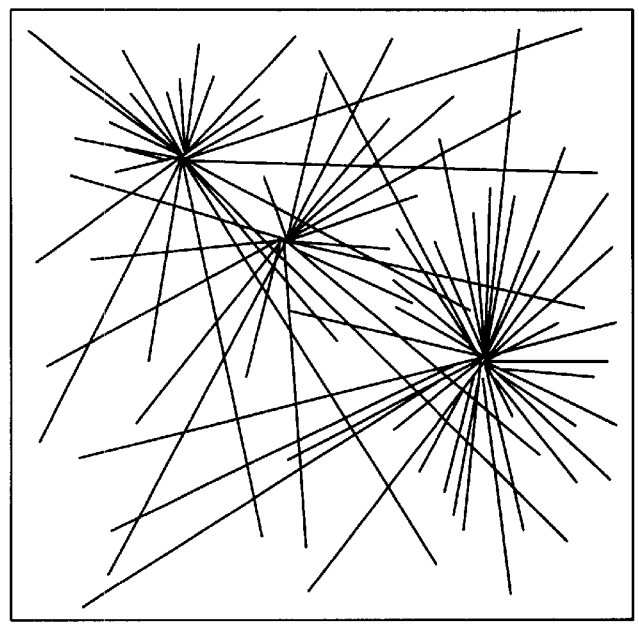
FIG. 1c is a diagram depicting an example of the related art's non-optimized physical placement of clock sinks on a semiconductor chip of the clock-gated integrated circuit design of FIG. 1a using the method of the related art depicted in FIG. 1b.

FIG. 1c is a diagram depicting an exemplary non-optimized physical placement of clock sinks on a semiconductor chip of the clock-gated integrated circuit design of FIG. 1a using the method of the related art depicted in FIG. 1b. In FIG. 1c the sinks of each of three domains are shown to be widely distributed across the whole area of a square semiconductor chip. The sinks of each domain are represented at the terminal end of each radial line. The purpose of the diagram of FIG. 1c is to illustrate the relative randomness and lack of density of the distribution of clock sinks of three domains by placement and chip design methods of the related art. The radial lines in FIG. 1c do not necessarily depict physical wires, but are drawn to represent a connection between each clock sink and one clock gate driving a gated clock signal to each of the clock sinks in its domain. As depicted in FIG. 1c, the clock sinks of each domain are typically dispersed across the surface of the chip with a relatively non-optimized sink density. Also, as depicted in FIG. 1c, in the placement methodology of the related art, the clock sinks of one domain are typically highly intermixed with the clock sinks of the other domains, such that there may be a very high degree of unnecessary overlap, even complete overlap, of the region of one domain by the other. The unnecessary and unintended overlap of independently gated clock domains tends to increase the capacitance of the clock tree.

The present invention reduces power consumption by minimizing the switching capacitance of the clock net of each domain by placing all the clock sinks of each domain in such close proximity (e.g., in one or in a plurality of sink-dense clusters) as will reduce the domain's clock network wire capacitance while not creating the wireability, skew or delay problems of the related art.

FIG. 2a-i is a diagram depicting an embodiment of the present invention on a semiconductor chip implementing the clock-gated integrated circuit design of FIG. 1a. FIG. 2a-i depicts three clock domains each having clock sinks that are clustered with a relatively high sink-density (compared to the sink-density of the entire circuit, and/or compared to the sink-density of each respective domain without clustering) rather than dispersed across the entire surface chip with a relatively low sink-density as depicted in FIG. 1c. The elliptical lines drawn enclosing each of the three domains are not necessarily conformal to a real shape of any domain, but serve to illustrate and distinguish the regions of each domain. The sizes of the regions of the three domains are not necessarily drawn to scale, but serve to illustrate a relative concentration and clustering of sinks as contrasted with the dispersal of clock sinks in FIG. 1c.

Figure 2B:
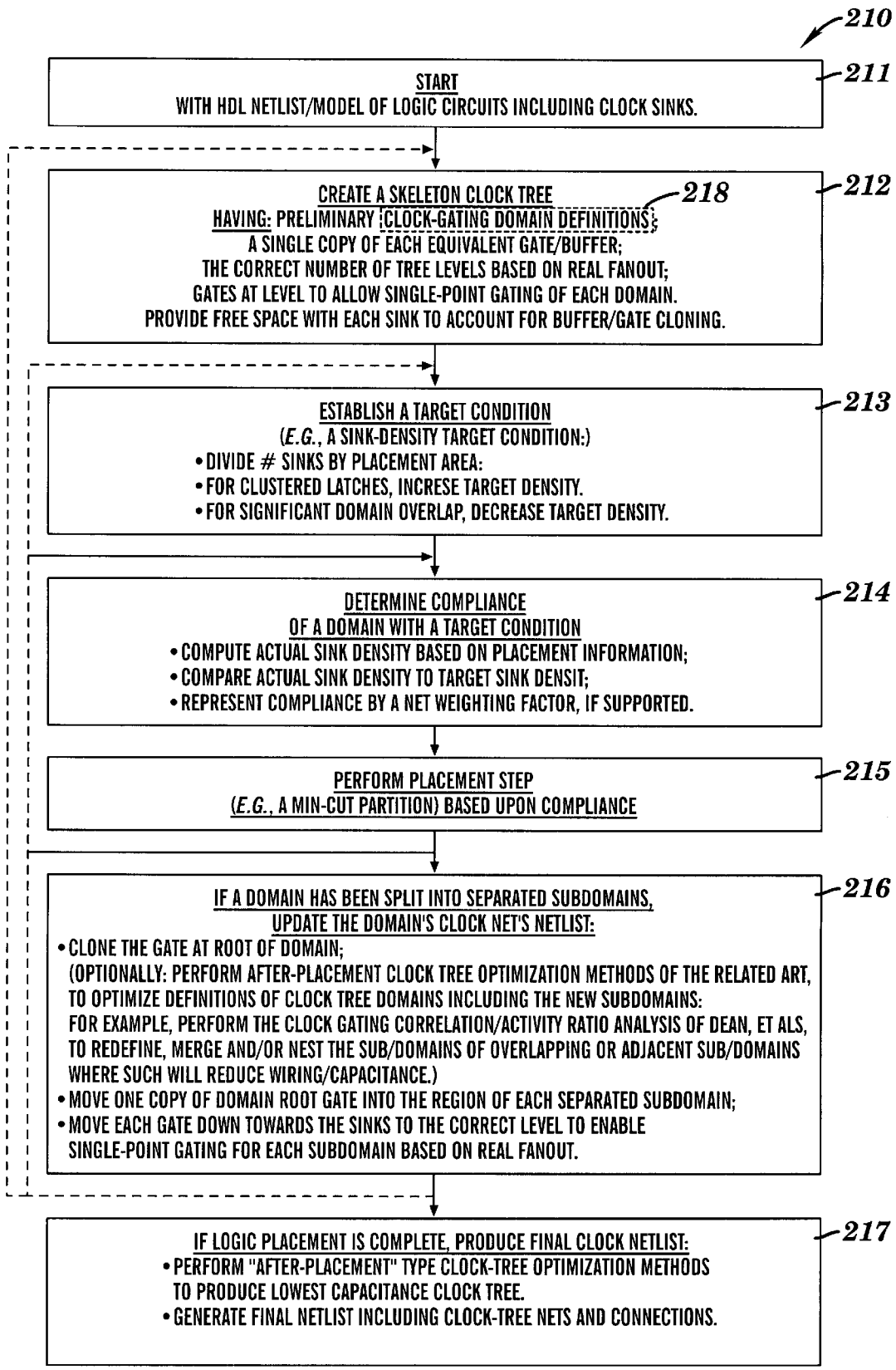
Figure 2C:
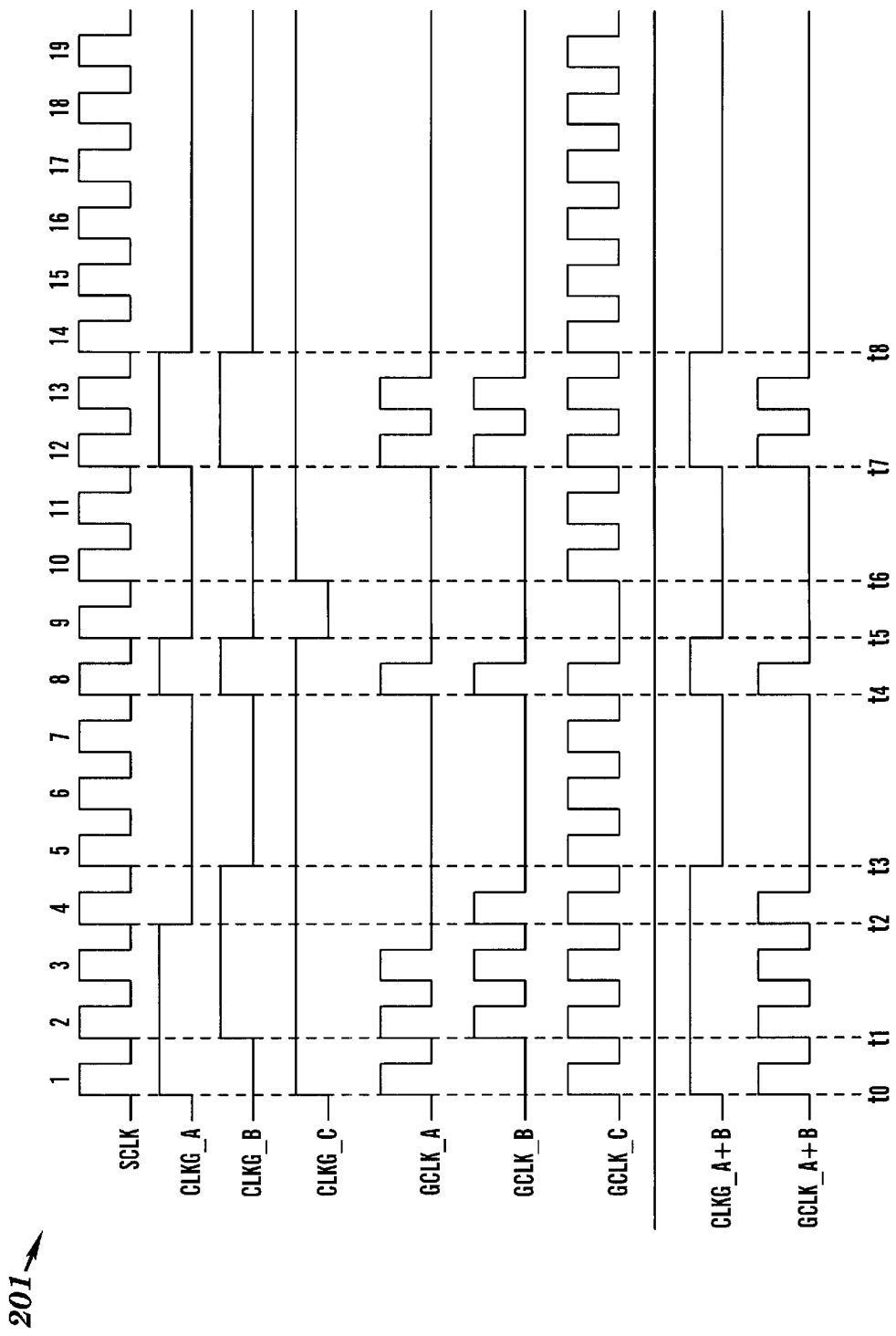

FIG. 2c is a timing diagram 201 illustrating the use of clock gating signals to produce gated clock waveforms in a integrated circuit (e.g., ASIC or Microprocessor) design. Specifically, the timing diagram 201 illustrates exemplary waveforms for the system clock signal (SCLK), the first, second and third clock gating signals (CLKG_A), (CLKG_B) and (CLKG_C), and the first, second and third gated clock signals (GCLK_A), (GCLK_B) and (GCLK_C).

With reference to FIG. 2c, the first clock gating signal (CLKG_A) and the second clock gating signal (CLKG_B) happen to be very similar. The differences between the first and the second clock gating signals (CLKG_A), (CLKG_B) occur between times t0 and t1, wherein the first clock gating signal (CLKG_A) is high and the second clock gating signal (CLKG_B) is low, and between times t2 and t3 wherein the first clock gating signal (CLKG_A) is low and the second clock gating signal (CLKG_B) is high. The third clock gating signal (CLKG_C) is only similar to the first or the second clock gating signals (CLKG_A), (CLKG_B) between times t0 and t3 and between times t5 and t6.

Figure 3A:
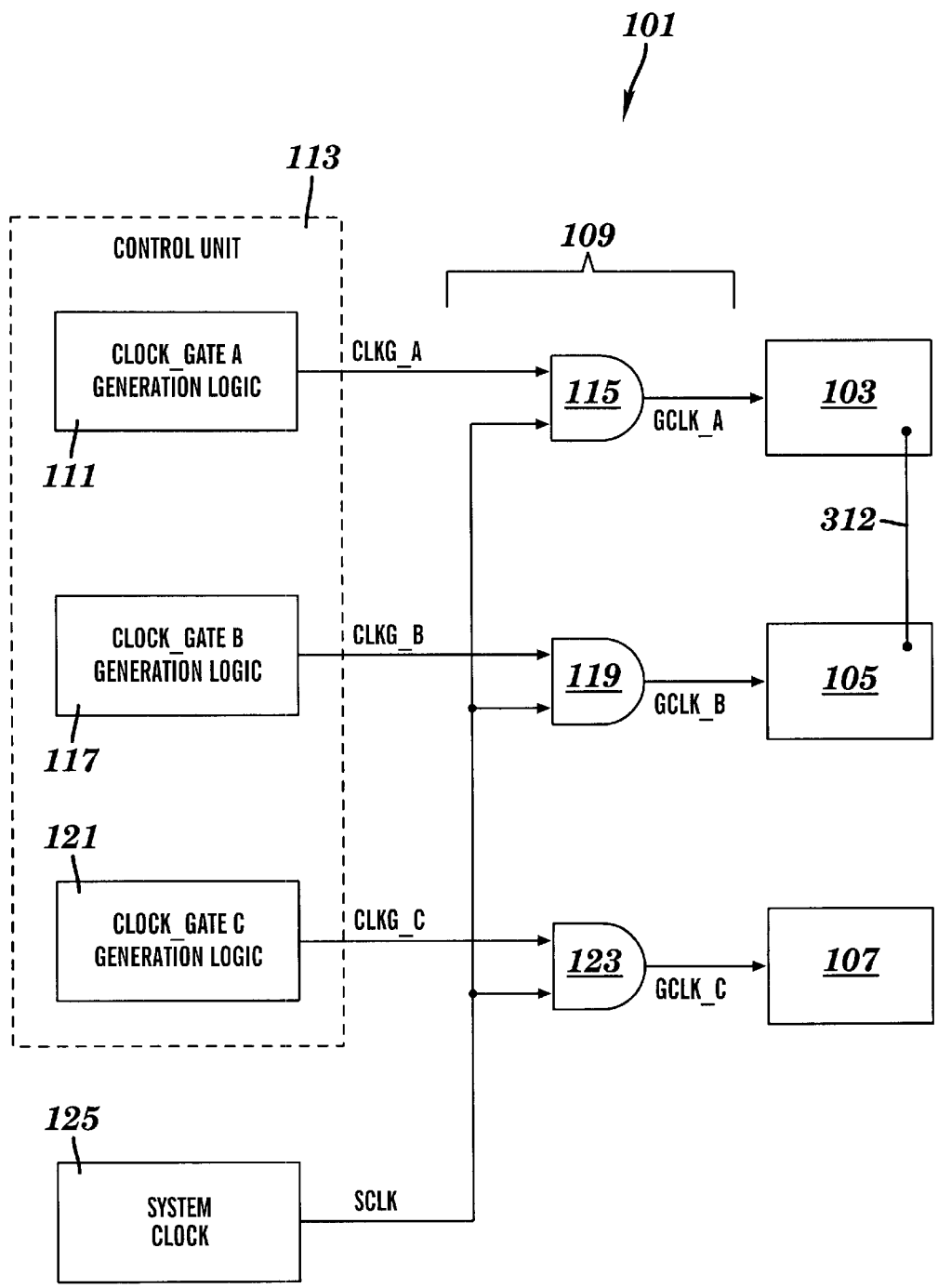
FIG. 3a is a simplified schematic diagram of a clock-gated integrated circuit design wherein there is a connection between a circuit element of one domain and a circuit element of a second domain.
Figure 3B:
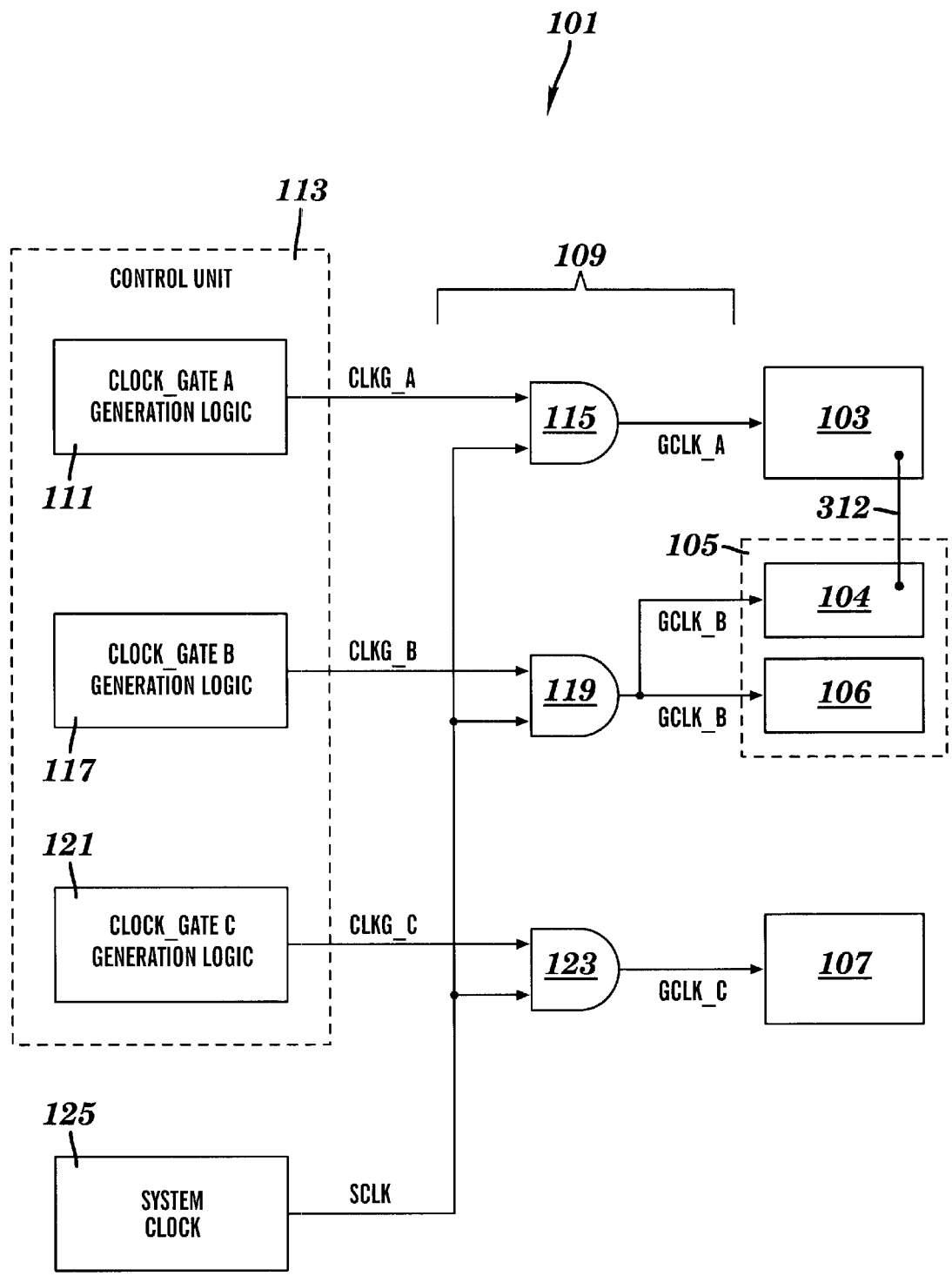
FIG. 3b is a simplified schematic diagram of a clock-gated integrated circuit design wherein there is a connection between a circuit element of one domain and a circuit element of a second domain, wherein the second domain has been partitioned into two separated subdomains in accordance with an embodiment of the present invention.
Figure 3C:
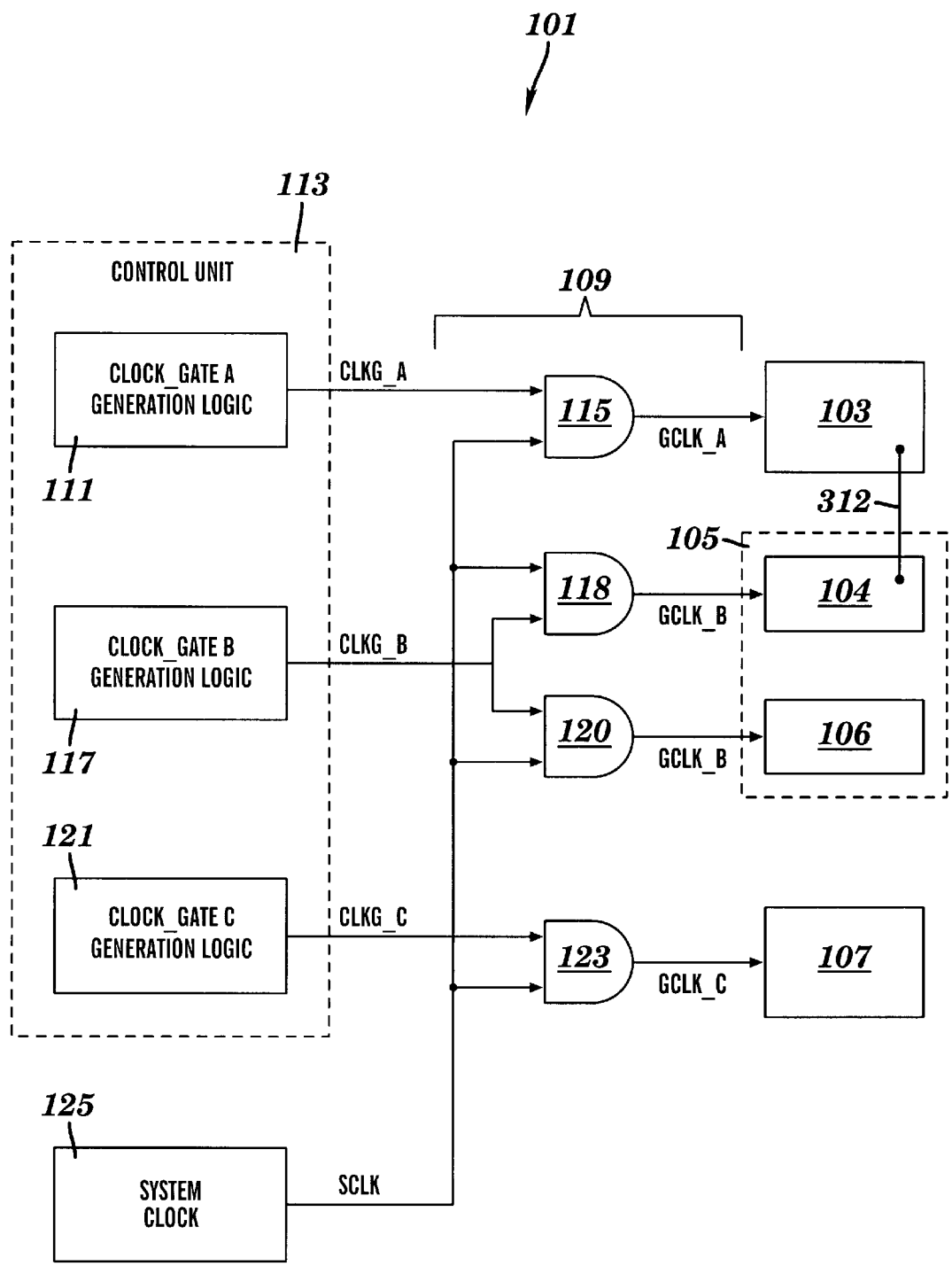
FIG. 3c is a simplified schematic diagram of a clock-gated integrated circuit design wherein there is a connection between a circuit element of one domain and a circuit element of a second domain, wherein the second domain has been partitioned into two separated subdomains and the domain's gate has been cloned to form to logically identical gates that are wired to separately gate each subdomain, in accordance with an embodiment of the present invention.

A pending patent application, Ser. No. 09/375,118, titled Methods For Improving The Efficiency of Clock Gating Within Low Power Clock Trees, invented by Alvar Dean, David Garrett and Mircea Stan, and assigned to International Business Machines Corporation, and incorporated herein by reference, teaches that: because of the high degree of similarity between the first and the second clock gating signals (CLKG_A), (CLKG_B), the two clock gating signals may be combined into a composite clock gating signal (CLKG_A+B) that results in a composite gated clock signals (GCLK_A+B) as shown in FIG. 2c; As depicted by reference to FIG. 3c and FIG. 3e, in this manner, AND gate 115 together with AND gate 118 may be replaced with a single AND gate 303 with only a slight loss in clock gating efficiency for first domain 103 and the subdomain 104.

Figure 2D:
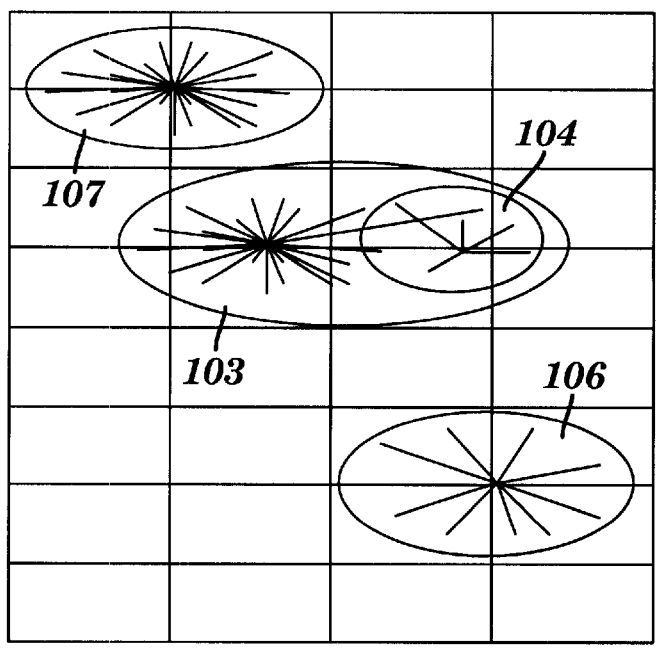
Figure 2E:
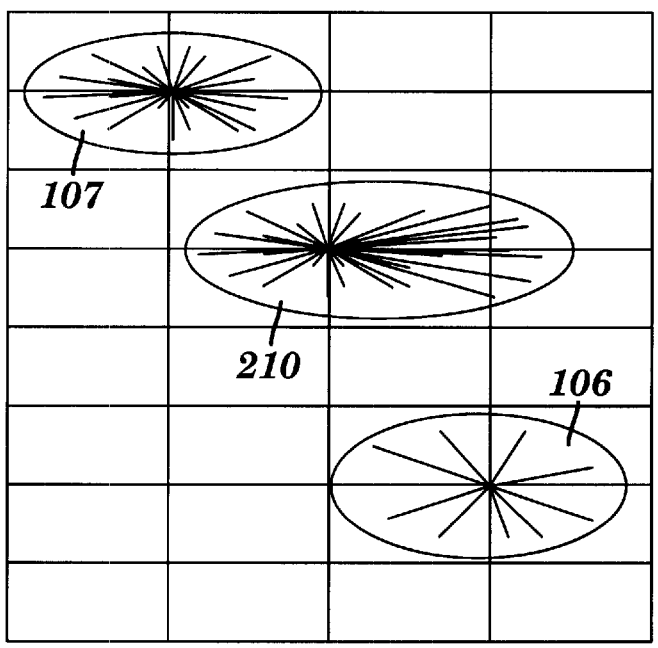
Figure 3D:
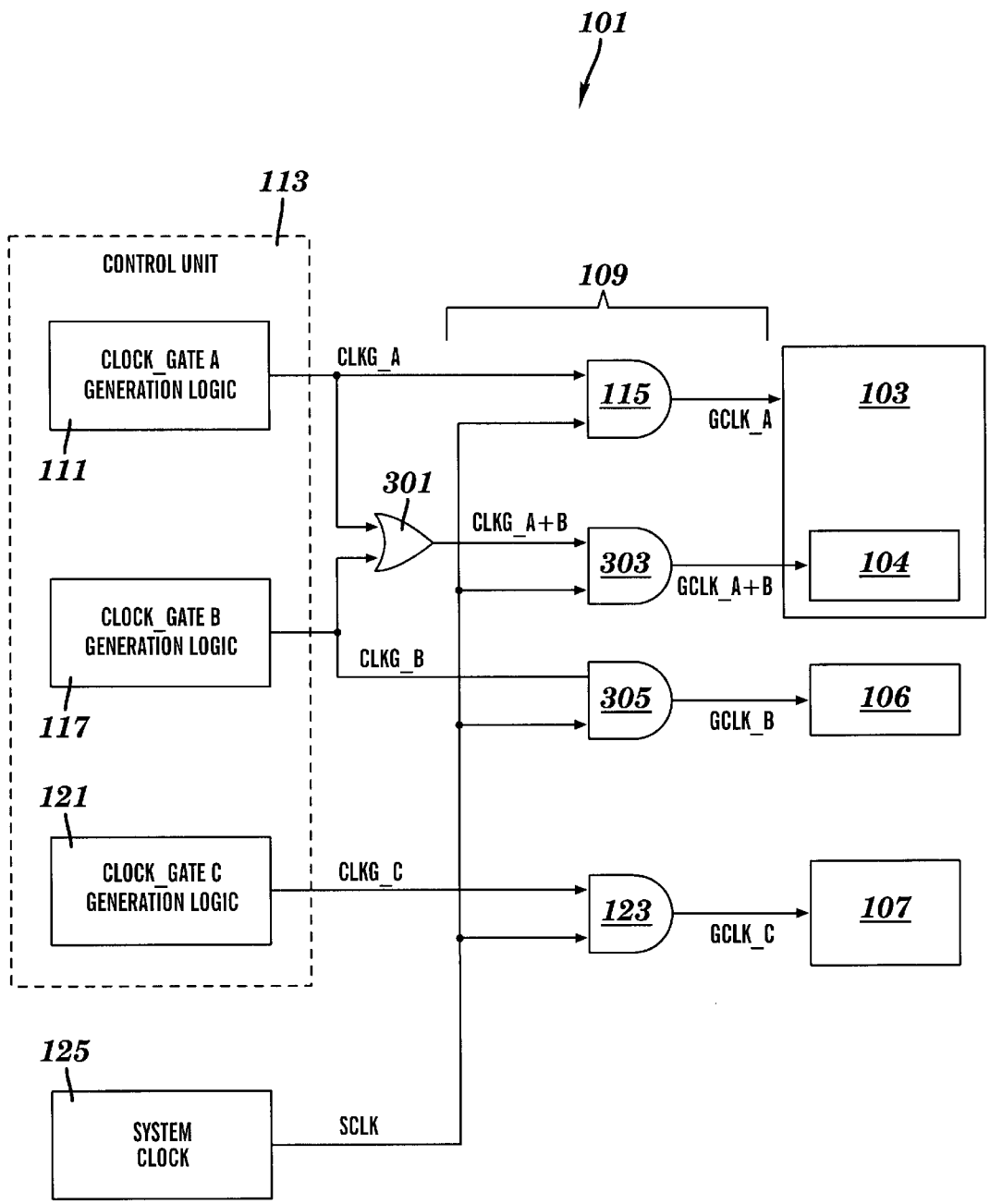
FIG. 3d is a simplified schematic diagram of a clock-gated integrated circuit design wherein there the logic circuits and sinks of one distinctly clocked domain are entirely nested within and integrated with the circuits of a higher level domain.
Figure 3E:
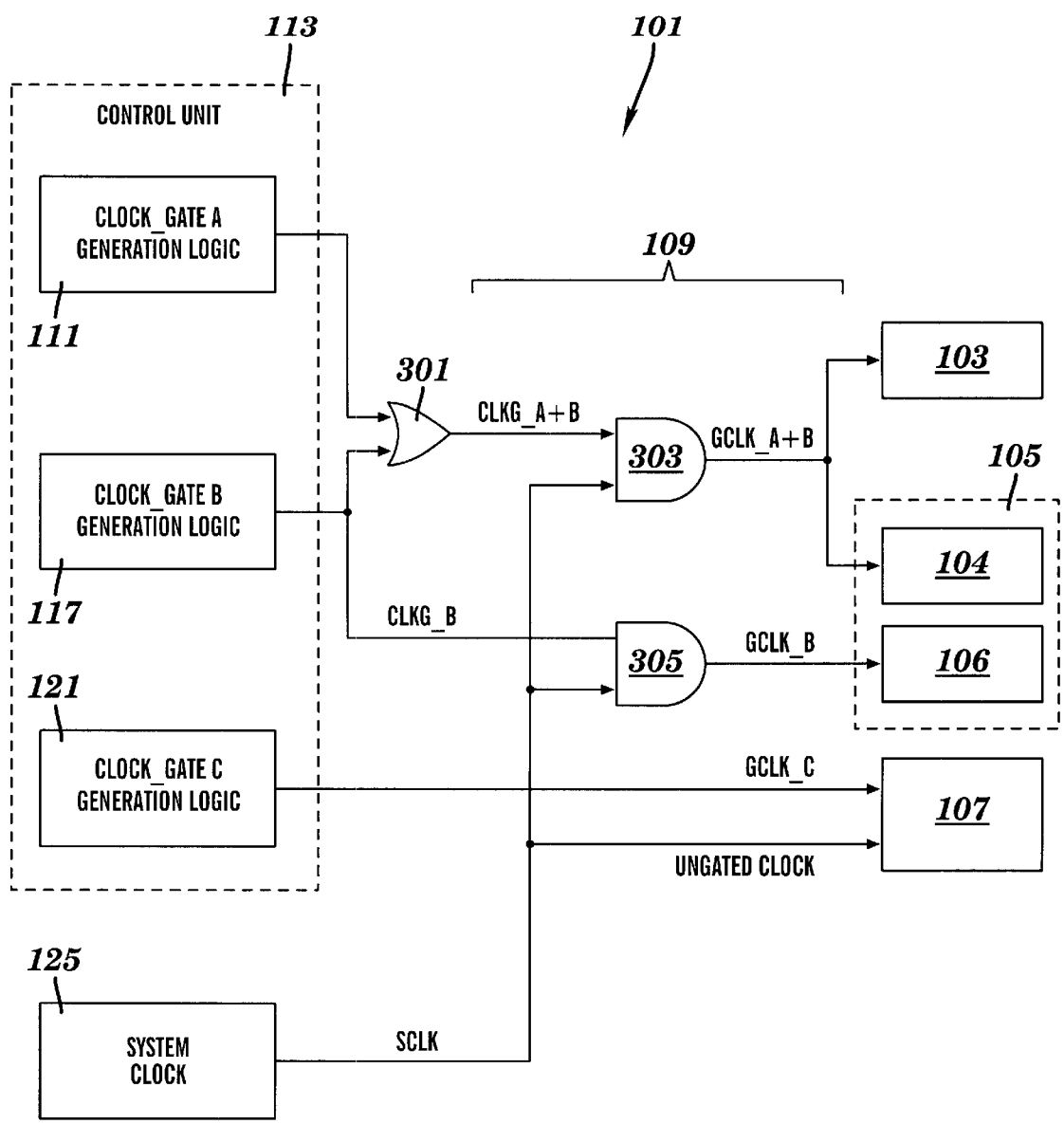
FIG. 3e is a simplified schematic diagram of an integrated circuit design employing a combined pair of clock gating signals and a single AND gate to generate a composite gated clock signal to control the circuitry of more than one clock domain, and one other (third) domain is clocked by an ungated clock signal.
Figure 3F:
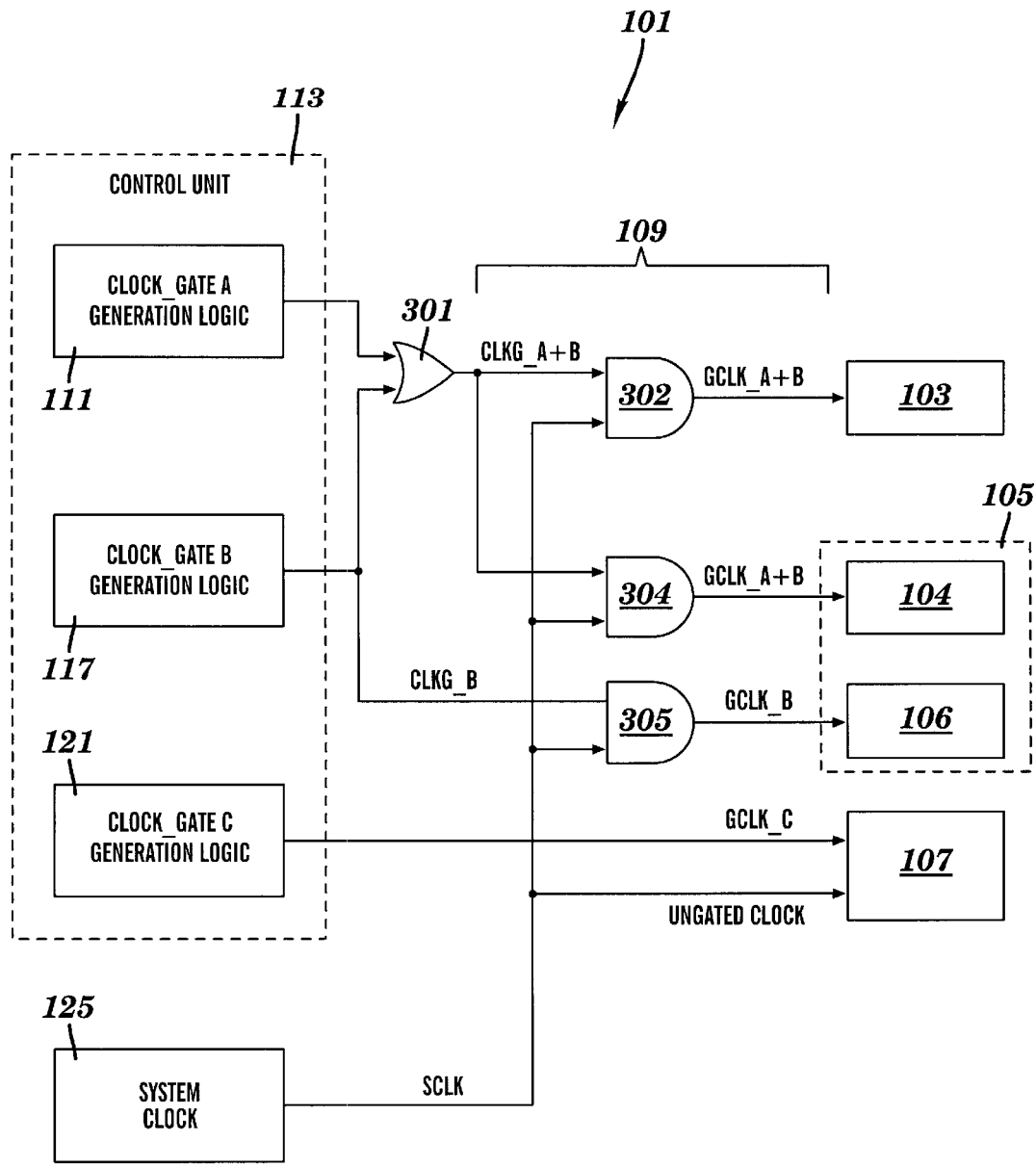
FIG. 3f is a simplified schematic diagram of an integrated circuit design employing a combined pair of clock gating signals and two (cloned) AND gates to generate the composite gated clock signal to control the separated circuitry one clock domain and a subdomain, and one other (third) domain is clocked by an ungated clock signal.
Figure 3G:
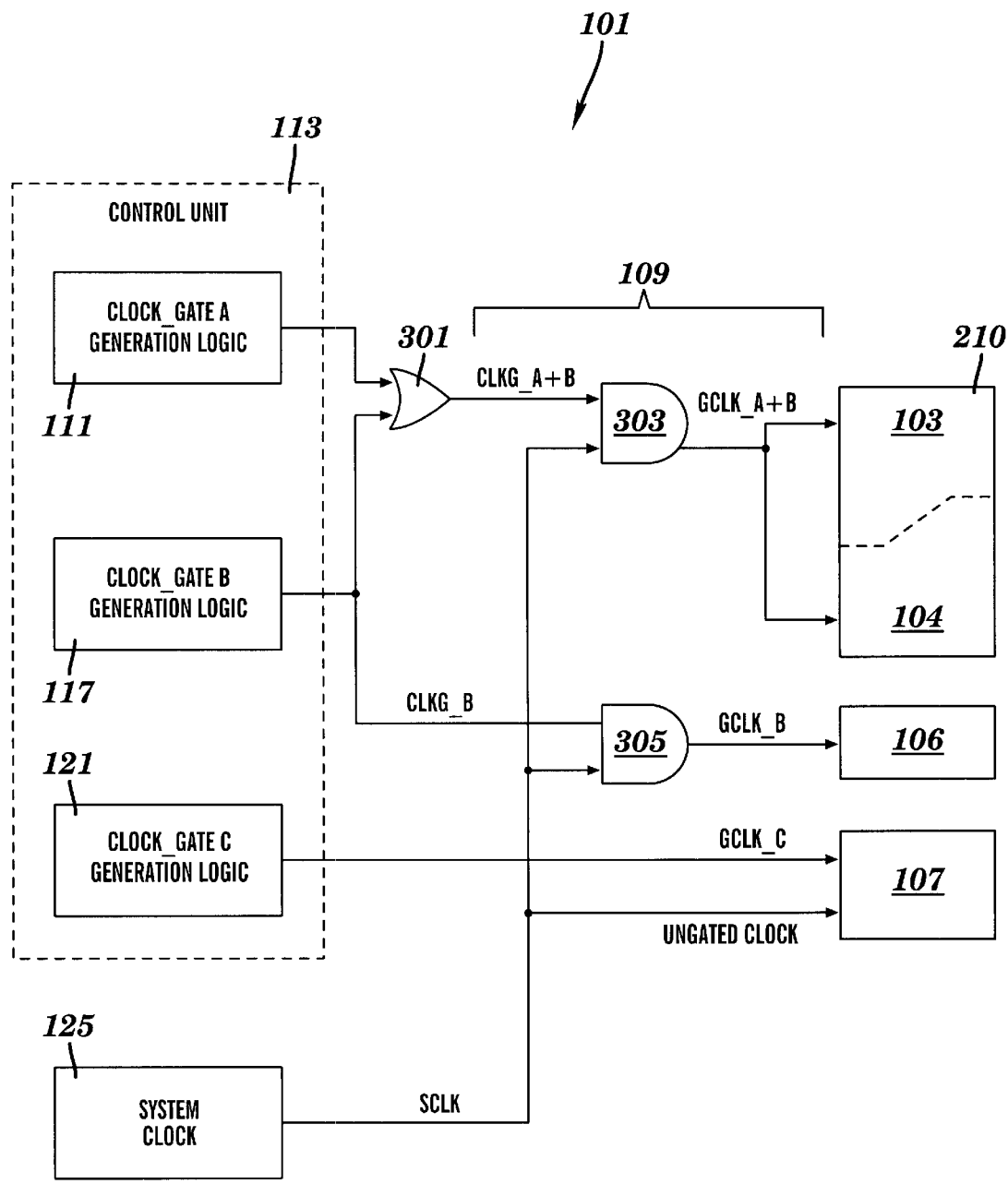
FIG. 3g is a simplified schematic diagram of the integrated circuit design of FIG. 3d wherein the a subdomain of one domain has been combined and merged with another domain to form one larger domain that includes the clock sinks of both, and a third domain is clocked by an ungated clock signal.
Figure 3H:
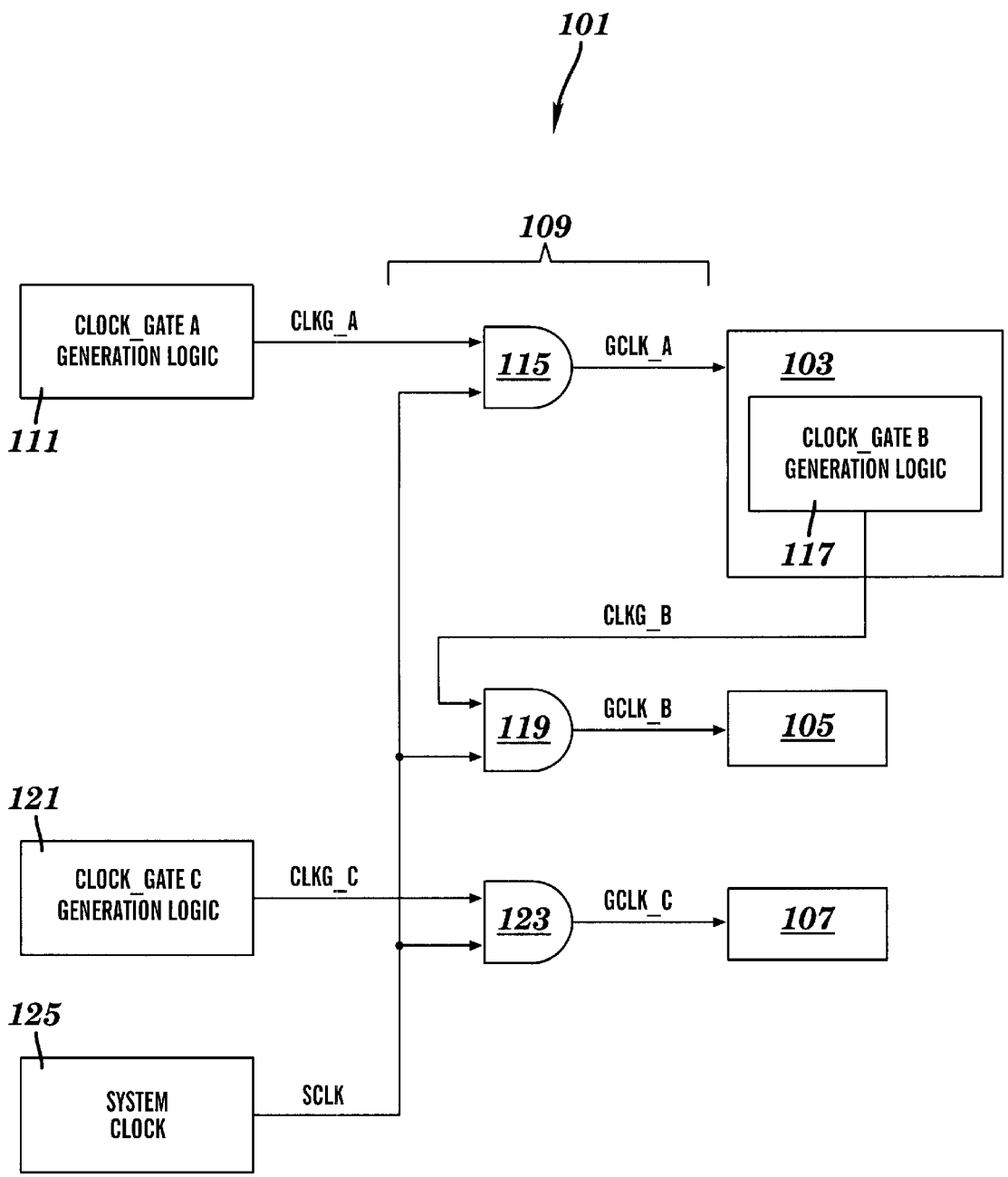
FIG. 3h is a simplified schematic diagram of a clock-gated integrated circuit design wherein the clock gating signal generation logic for gating the clock signal controlling one domain is generated by circuitry contained within the circuitry of another domain.

In accordance with an embodiment of the present invention, the domain 103 and subdomain 104 that were previously clocked by different gated clock signals and that are now clocked by the same signal in FIG. 3e, may be treated as one new (i.e., newly defined) domain 110 as depicted in FIG. 2e and in FIG. 3g. In accordance with an embodiment of the present invention, during placement the sinks of the two previously distinct sub/domains, (i.e., domain 103 and subdomain 104) may be merged into one domain-region (as in FIG. 2e and FIG. 3g), or kept in separately-gated sub/domain-clusters (as depicted in FIG. 2a-ii and FIG. 3c) with separate gated clock signals (e.g., GCLK_A & GCLK_B as in FIG. 3c), while the sink-density of each is increased to reduce capacitance. A maximal reduction in power consumption for the integrated circuit design 101 may thereby be achieved. In accordance with an embodiment of the present invention, a substantial reduction in power consumption may be obtained by reducing the capacitance of the net of each domain (e.g., by increasing the sink density of each domain during placement) without combining their clock gating signals (as depicted in FIG. 2a-ii and FIG. 3c)

In another embodiment of the present invention, additional power consumption savings may be effected by increasing the sink density of the third domain 107 with or without gating by the corresponding third clock gating signal (CLKG_C). With reference to FIG. 2c, the third clock gating signal (CLKG_C) happens to be high over 90% of the time period shown. Accordingly, the third gated clock signal (GCLK_C) is almost always active.

The pending Patent Application of Dean et als. teaches that the third AND gate 123 preferably is eliminated when the third domain 107 represents only a small portion of the power-consuming circuitry (e.g., only about 10% of the logic circuitry) of the integrated circuit design 101, because the use of the third AND gate 123 so as to generate the third gated clock signals (GCLK_C) consumes more power than allowing the system clock signal (SCLK) to clock the third logic block 107 directly (i.e., ungated). In order to reduce the power consumed by the logic circuitry of the third domain, with or without ungating of the clock signal (CLKG_C) controlling that domain, physical circuit placement is performed in accordance with an embodiment of the present invention such that the sink density of that third domain 107 is increased, thereby reducing its clock net's capacitance.

FIG. 3d and FIG. 3e are schematic diagrams of the integrated circuit design 101 employing an OR gate 301 to combine the first and the second clock gating signals (CLKG_A), (CLKG_B) to form the composite clock gating signal (CLKG_A+B). FIG. 3e illustrates a single AND gate 303 coupled to the OR gate 301 so as to generate the composite gated clock signals (GLKC_A+B) for both the first domain 103 and a subdomain 104 split off from the second domain 105, and employing no clock gating for the third domain 107.

Many embodiments of the invention comprise the use of available information about the clock signal distribution network and/or the clock sinks of domains thereof to influence the placement of logic circuits on a semiconductor substrate in such a manner as to produce low-capacitance clock net(s) for each domain, without creating wireability, skew, and delay problems of the related art. Several embodiments of the invention place clock-sinks of each domain into one or more clusters (i.e., arrangements of clock sinks of a given domain in relatively close proximity to each other), whereby various after-placement clock tree optimization techniques may be applied to result in highly optimized low-capacitance clock signal distribution networks and low-power integrated circuits.

Embodiments of the invention may operate in conjunction with a cut-based placement program (such as International Business Machine Corp's Cplace™ computer software) which iteratively restricts the locations of placeable circuit elements by partitioning some of the components from the other elements with "cuts," thereby progressively confining the individual components in the model to smaller and smaller regions of the placement region. Through interaction with Cplace, the chip designer can control as much of the placement as desirable, and leave the rest for Cplace™ to determine. Logic circuitry to be placed by Cplace™ is coded hierarchically in a high level language. Cplace™ has the capacity to handle large objects, fixed objects, fixed I/Os, non-rectangular images, net weighting, timing driven placement, and freespace distribution. Free space is that part of the image that is vacant after all of the circuits are placed and is modeled as a number of dummy objects so that the placement program can manipulate them. Chip designers may provide a number of dummy objects in the netlist to leave room for the clock signal buffers and clock gates which shall be added to implement the final netlist including clock tree components such as buffers and gates.

One of the fundamental characteristics of the Cplace™ implementation is that a real placement is maintained at all times. Many other programs rely upon an abstract model of placement. Because Cplace™ has real placement information at all times, Cplace™ is able to make placement decisions that depend upon information about the actual current state of the placement, thus allowing subsequent placement decisions to be made based on a more accurate picture of the placement as it evolves. To implement placement-information dependent decisions, Cplace™ simply consults or measures the current placement features and image, with no translation or approximation required. An added benefit of the real-placement approach is that discrepancies (between the partition assignment and what is actually achievable) and potential wireability problems can be detected immediately, and avoided or designed around. Similarly, improvements to domain definitions that are revealed only after some placement has provided information about the location of the regions of domains, can be readily applied to the placement process in subsequent placement steps or upon a restart of placement with updated domain definitions.

The basic placement algorithm used by Cplace™ is the min-cut "divide and conquer" method. Cplace™ can performs "cuts," which divide the elements in a region into two adjacent cells. Each cut doubles the number of cells present. The first cut divides the design into a left cell ("A-side") and a right cell ("B-side"), such that the wires crossing the boundaries between cells are minimized. The second cut divides each of these cells into a top and a bottom, resulting in a top_left, bottom_left, top_right, bottom_right cells. This pattern repeats until the cells are numerous and small. At this point, each and every circuit in the design has a physical position that has been narrowed down to a few microns. When all cuts are completed, some minor cleanup is done to produce the final legal placement of the logic circuitry.

Figure 2F:
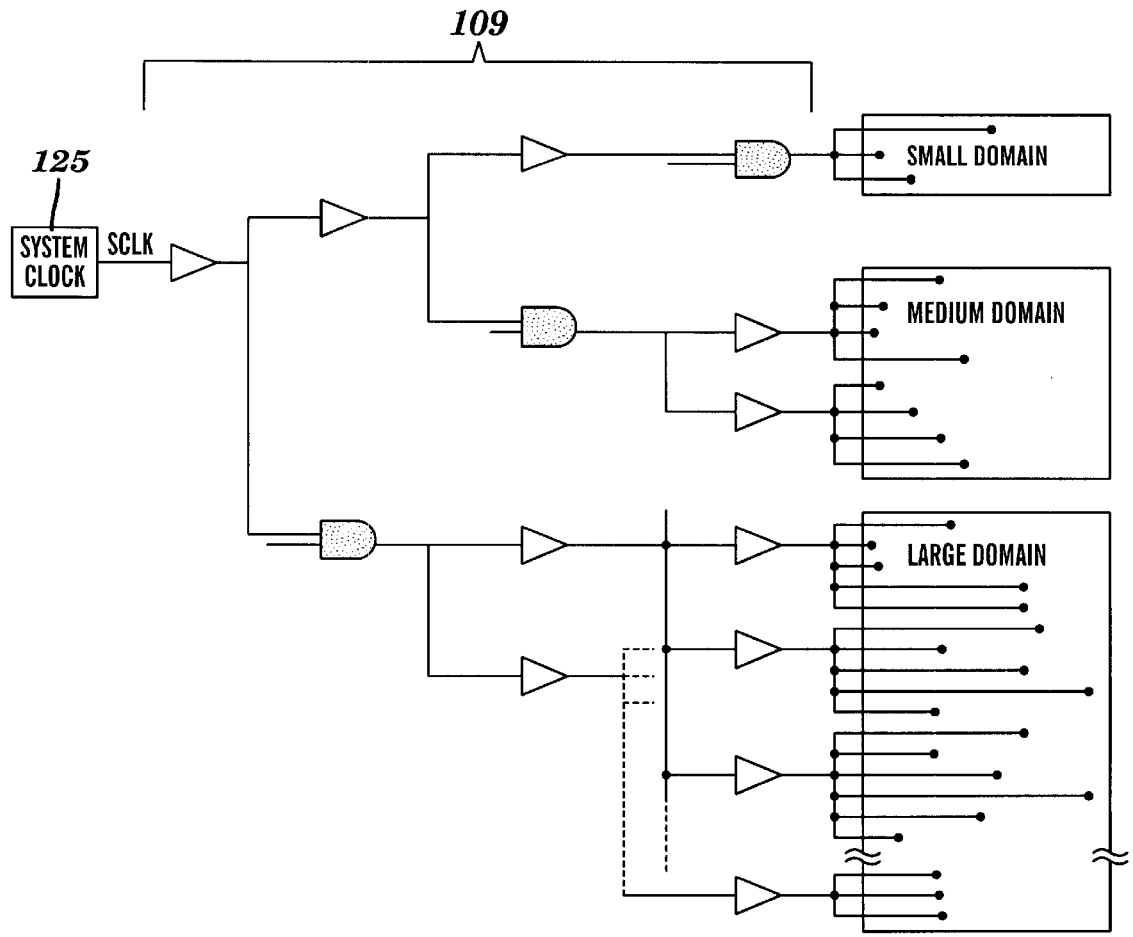
Figure 2G:
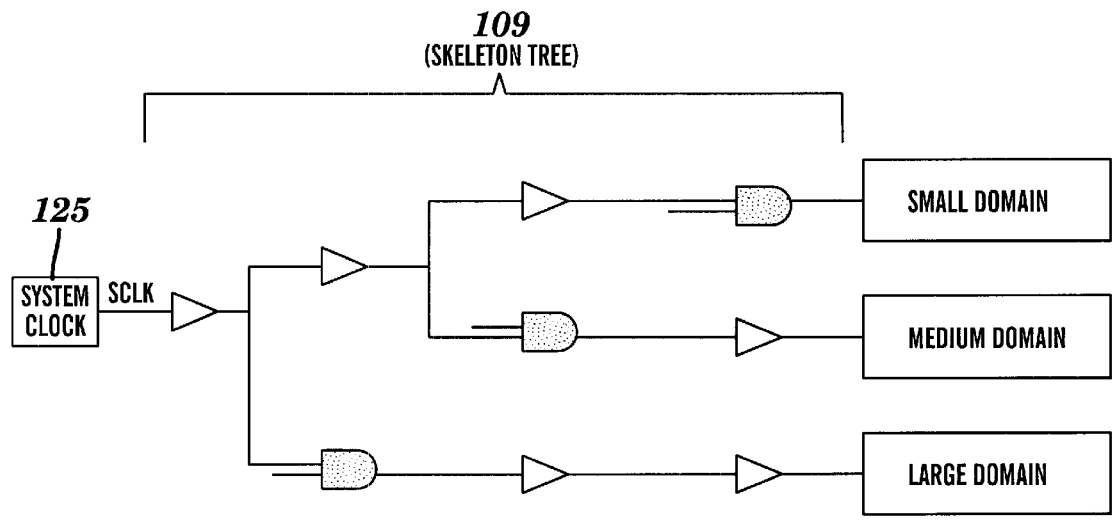

The partitioning algorithm of Cplace™ operates with an interconnection "weighting" protocol that assigns "weights" to particular connections between two or more components. The higher the "weight" of the connection between the components, the less probable it is that they will be separated (i.e., placed on different sides of the "cut"). Conversely, the lower the "weight" of the connection, the less probable it is that the components connected thereby will be located in the same region after all iterations of the algorithm are completed. This protocol also allows for connections between a multitude of components, such as a network, or a subnet, to be weighted, such that all the components connected to the net or subnet will be placed together in one region, or in adjacent regions. Therefore, in an embodiment of the invention, all the gated clock sinks (e.g., latches) of a particular clock gating domain may be placed together in a cluster by weighting the "net" interconnecting those sinks. The "net" interconnecting the sinks of one domain could be temporarily modeled during placement by a netlist linking all the sinks of the domain to a single gate, or directly to the circuit that generates the clock gating signal. Alternatively, the "net" interconnecting the sinks of one domain could be temporarily modeled during placement by part of the netlist of a skeleton clock tree wherein all the sinks of the domain are linked to a single buffer or gate. FIG. 2g illustrates the characteristics of a skeleton clock tree. Alternately, the "net" interconnecting the sinks of one domain could be temporarily modeled during placement by part of the netlist of an initial real clock tree topology having the appropriate number of levels and an appropriate fanout from each gate and buffer. FIG. 2f illustrates the characteristics of a clock tree with a real fanout, as contrasted with a skeleton clock tree. As placement proceeds, changes to the netlist of the clock tree and/or the net interconnecting the sinks of one domain can be made. For example, where a domain is split into two subdomains, the net of that subdomain may be divided into two nets and parallel copies of the appropriate gate may be included to separately gate each subdomain. If a domain has been partitioned into two non-adjacent placement bins (i.e. separated regions), the netlist of the domain's clock net can be modified as follows: clone the gate at the root of the domain; move one copy of each root gate into each separate physical region correcsponding to each subdomain; move the root gates down, towards the leaves (sinks) as necessary, to the correct level of the clock tree to allow for single-point gating for each subdomain. The final clock netlist can be generated and optimized after placement is compete.

By dynamically changing the weighting of the net of each domain or subdomain between iterations of the placement algorithm (e.g., after determining the extent to which a domain is in compliance with a target condition, and before each placement refinement), the sinks of a domain may be placed in compliance with the target condition, and thereafter remain in compliance with the target condition. When the domain is placed in compliance with the target condition and further placement refinement cannot take the domain out of compliance with the target condition, the weighting factor of that target condition may be changed (e.g. fixed at "zero") so that that target condition will have no influence upon a subsequent placement refinement. For example, when after a plurality of placement refinements (e.g., cuts), the bins containing the sinks of particular domain are of such small total area that the sink density of the domain is with certainty higher than the value of a minimum sink-density target, further placement refinements cannot take the domain out of compliance with the target condition. Although during the first several cuts of the placement process the bins may be too large to determine with certainty that a domain will be placed in compliance (e.g., with a sink-density type target condition), it is possible to determine the extent to which a domain is in compliance with a target condition at least insofar as the lack of certainty of a domain's compliance with the target condition may be treated as a lack of compliance with the target condition.

By performing placement refinements in accordance with the method of the invention, the density of the sinks in each domain can be confined to a preselected value based upon a target condition such as a "target sink density," or a domain may be split into two or more "subdomains" placed in separate regions on the chip each having a specific sink density. The selection of a "target sink density" that is equal to or greater than the average sink density of clock sinks on the chip without any clock gating, can ensure that after-placement clock optimization methods will result in a savings of power.

In an embodiment of the invention, a target sink-density condition would be assigned a minimum target sink-density value that significantly exceeds the nominal sink density of the ungated clock tree, thereby attempting to force the splitting of a domain and/or reduce total wire capacitance and increase power savings. Because a greater target sink density condition may force very tight clustering of the sinks of one domain, it becomes more likely that the domain may need to be split into two or more separated regions in order to comply with the sink-density condition and with wireability or other constraints.

A domain might be "split" into non-adjacent regions when two or more sinks in that domain are connected (by highly weighted connections) to two or more components that must be physically placed in widely separated regions of the chip, thereby forcing placement of the two or more sinks of the domain into separate regions, thereby defining potential subdomains. In this manner, wireability problems, skew and delay which could arise from long wires in the highly weighted connections are avoided by splitting the domain into subdomains located in separate physical regions. Each subdomain is likely to "follow" its most highly weighted connection to another domain. For example, the highly weighted connection 312 (in FIG. 3c) between domain 103 and subdomain 104 may cause subdomain 104 to be placed adjacent to, or to overlap (FIG. 2a-ii) domain 103, and ultimately to be merged with domain 103 to form a new domain 210 that includes the sinks of both 103 and 104.

When a domain is located, or split into subdomains in known regions on the chip, the after-placement-type clock tree optimization methods of the related art may be immediately employed (i.e., employed without waiting for complete placement) to determine whether it would be more energy efficient to provide each sub/domain (i.e., a domain or a subdomain) with its own physical gate, or instead to leave that sub/domain ungated (i.e., "ungating"), or instead to merge or to nest that sub/domain within some other sub/domain. The methodologies of the present invention therefore enhance the functionality and usefulness of the after-placement-type clock optimization methods of the related art, by providing opportunities for their use at much earlier stages of logic circuit placement process (i.e., before final placement), thereby effecting greater optimizations.

Even without resort to any after-placement-type clock optimization methods during the inventive placement process, the placement methodology of the present invention can yield a clock tree in which sinks controlled by the same gated clock signal (e.g., in the same domain) are gathered into one or more low-capacitance physical clusters or regions, each having a separate physical clock gate that gates the clock signal feeding each sink in such a cluster, but which are not so distanced or isolated from other connected domains as to create wireability problems and other problems associated with the related art. When all of the sinks of a domain are tightly clustered, gating the clock signal will not substantially increase clock net wiring, and a reduction of power consumption is likely.

Between "cuts," Cplace™ and/or the human circuit designer can modify a target condition, and/or update the circuit's netlist and the weights of connections and nets, thereby redefining how hard Cplace™ should try to force a certain target condition, such as keeping all the clock sinks of one domain clustered together, or separated from the sinks of other domains. Cplace™ generally uses a bi-partitioning cut-based placement algorithm. Cplace™ can also utilize an extension to bi-partitioning by using a partitioning platform that has an additional entity called the "C-SIDE". The partitioner's primary task is to move circuits between the A and B side such that the number of nets crossing the cut line is minimized. In the event that an object can not be modeled accurately as being in either the A or B side, it is modeled as being in the "C"-side. This situation arises in two ways. The first is where an object is fixed (by the user) such that it spans the cut line currently being optimized. The second is that the object is very large relative to the size of either the A or B side, and may actually occupy both. In these cases the terminal points of the circuits may be such that some of them fall to one side of the cut line while others fall to the other side. The actual location of these terminal points must be modeled so that as we move objects between the A and B side the actual number of nets crossing the cut line can be determined and optimized. Thus the C side of Cplace™ facilitates the ability to handle fixed objects and large objects. In addition, it is the C side that provides the capability of controlling the free space distribution. The free space is that part of the image that is vacant after all of the logic circuits are placed. Free space is modeled as a number of dummy objects so that the placement program can manipulate them. To control the distribution of the free space a user-defined percentage of these objects may be placed in the C side of every partitioning operation. These are then ignored by partitioning, resulting in an equal number of them being assigned to the A side and the B side. Free space objects not assigned to the C side may or may not end up equally distributed.

The invention could also be practiced in conjunction with a Quadrisection-based placement algorithm, or any other placement algorithm that progressively restricts the locations of placeable elements, and can update the logical element netlist and the weights of connections and nets. It is believed that the invention can be practiced in conjunction with commercially available modeling and placement software such as Verilog® by Cadence Design Systems or VHDL which provide a high-level design language (HDL) model for IC and microprocessor design.

In one or more embodiments of the invention, wherein a target condition is a domain "sink density" (e.g., latch density), a part of the inventive method is to compute the sink density of the integrated circuit (including the sinks of all domains; and/or without any clock gating), and then try to force the sinks of each gated clock domain into clusters (placed in one integral region or in a plurality of separated subregions) each having at least that sink-density, and/or further splitting the clusters (into separated subdomains) and providing another physical gate when necessary. The sink-density of a cluster (e.g., a domain or each subdomain) can be approximated as the lower bound of sink-density calculated as: the number of sinks in the cluster divided by the total area of all bins containing the sinks of that cluster. In this embodiment, the invention can collect subsets of sinks of one domain into a plurality of separated clusters if that is what is needed to achieve a logic placement that, with an optimized gated clock tree, reduces power consumption and avoids wireability and other problems of the related art. The end result should then be a clock tree which has about the same or less total wire capacitance as would be required for a non-gated tree, but which gates off sub-trees to reduce power consumption.

In another embodiment of the invention, wherein a target condition is a limit on the degree of overlap of the physical regions that domains occupy, an objective is to try to force all the sinks of a gated domain into an exclusive physical region of the chip and/or splitting the domain as necessary into gated subdomains, wherein one or more such subdomains occupies exclusively a region of the chip. The degree of overlap of first domain region upon a second domain region may be objectively quantified as finite area or as a proportion or a percentage of the total area of the second domain region. The degree of overlap of a second domain region upon the first domain region may be objectively quantified as finite area or as a proportion or percentage of the total area of the first domain region. Percentages of overlap of domain regions may be calculated by identifying the perimeter and area of the region containing all the sinks of a firs t domain, and identifying the perimeter and area of the region containing all the sinks of a second domain, and then calculating the percentage of the area of the first domain that is overlapped by the region of the second domain, and vice versa. The area of each region may be approximated by the area of all the cells (i.e., placement bins) produced during placement iterations that contain sinks of such a domain. The more overlap there is of one domain region upon another, the more "mixing" of sinks of the two domains there will be. The more overlapping of domains and mixing of sinks of different domains there is in the same physical area of a circuit, more wiring overhead will be created in order to route their separately gated clock signals independently, which can also increase the effective capacitance of the gated clock tree. Additionally, the increased presence of crossing wires in the same physical area carrying different gated clock signals tends to increase the need to provide additional wiring planes and through-holes on the chip, thereby potentially increasing the complexity and cost of manufacturing the IC chips. From a clock tree capacitance and efficiency perspective alone, a zero overlap of all domain regions, whereby each domain would occupy a completely separate physical region on the chip, may be ideal. However, for the reasons mentioned in the background, a complete separation between the physical regions occupied by two or all intact domains on a chip can create or aggravate skew, delay, and/or wiring problems in Large Scale Integrated (LSI) circuits or Very Large Scale Integrated (VLSI) circuits, and may result in inoperable or unreliable circuits. Therefore, an important feature of the invention is that a target condition that is a non-zero overlap may be established for one or more domains or subdomains, thereby avoiding the problems of the related art while reducing the degree of overlap as much as may be possible. Also, the invention can split a domain (e.g., a zero-overlapping domain) into two or more subdomains each having either zero overlap or non-zero overlap with other domains and subdomains. Further, a different overlap target condition can be specified for each domain or subdomain such that one domain or subdomain having a zero overlap target condition might be placed in an exclusive physical region on the chip while other domains and subdomains are allowed to overlap other domains and subdomains in accordance with their separate target conditions. This flexibility allows for the optimization of clock trees without creating or aggravating the skew, delay, and/or wiring problems associated with the related art.

An example of advantageous use of setting different overlap target conditions for each domain would be to set the overlap target condition of every domain that has no external connections, or no connections to remote logic circuits, to zero-overlap or to a minimal overlap (e.g., 10% of the area of the domain region), while setting domains or subdomains having numerous connections with remote logic circuits to a non-zero overlap target condition. This would reduce or eliminate unnecessary overlap and/or splitting of domains while allowing overlap where such overlap is unavoidable under wireability or other constraints.

In practice, the designer could define the value of the overlap target condition by prescribing some maximum allowed domain overlap percentage. Alternatively, the overlap target condition could be expressed as a finite surface area quantity that may not be exceeded, thereby allowing that finite area of overlap independent of the total surface area of the domain's physical placement region. As an alternative to a predefined overlap target condition, the placement software could be programmed or augmented with subroutines to detect wireability, skew, or delay problems due to an attempted zero-overlap target condition, and automatically adjust the overlap target condition upwardly until the problems can be avoided in placement. Conversely, the placement software could be configured to automatically adjust the overlap target condition downwardly from a high value until problems such as wireability, skew, or delay problems attributable to the overlap target condition's value are detected. A sink-density target condition could be similarly adjusted automatically to find an optimal value for each domain or subdomain.

In a step of the inventive method where a net's weight is to be determined based on compliance with target conditions, where a target condition is an overlap target condition, the placement software would determine whether a domain overlaps any other domain by more than this overlap limit. If a domain is not in compliance with a maximum overlap target, the weight of its net can be set to some non-zero value to attempt to cluster the domain more tightly, and/or its netlist can be modified to include one or more connections with circuit elements or with finite locations on the chip that are known to be or presumed to be clear of (exclusive of and away from) the region of the overlapped domain. These and various other means practicable by persons skilled in the art could be employed to "push" or "pull" one domain or subdomain away from another or towards a particular other location or sub/domain.

Where it may be desirable to have a high degree of overlap, or complete overlap, of two of more sub/domains (i.e., domains and/or subdomains), the inventive methods may be employed to try to force such overlapping. A chip designer skilled in the art and in the methods taught in the pending patent application of Dean et als., may choose to deliberately overlap two or more domains or parts thereof (e.g., subdomains) because their clock gating signals are so similar that the greatest power efficiency might be obtained by gating the sinks of both sub/domains as one domain with the same clock gating signal (e.g., a composite, e.g. GCLK__A+B) rather than as separately gated domains. Using the placement methods of the present invention, the sinks of the two sub/domains can be brought together into one or more overlapping clusters having a relatively high sink-density, thereby facilitating the minimization of net capacitance of all of such commonly clustered sinks. FIG. 2a-i and FIG. 2a-ii and FIG. 2d and FIG. 2e and FIG. 3d and FIG. 3e and FIG. 3f and FIG. 3g and FIG. 3i together illustrate how the domain-splitting and clustering methods of the present invention can be used in conjunction with the methods of Dean et als.. FIGS. 2a-i and 2a-ii illustrate how a low-density domain (i.e., a domain with a relatively large region containing relatively few sinks) 105 with a connection 312 to another domain 103 may be split in accordance with an embodiment of the present invention 210 into two separated subdomains 104, 106 each having a higher sink-density than 105. The separated subdomain 104 with the connection to the adjacent and/or overlapping domain 103 may have a clock gating signal (CLKG_B) so similar to the clock gating signal of 103 (CLKG_A) that (in accordance with the disclosure of Dean et als.) power savings might result from gating both the domain 103 and the subdomain 104 from the same clock gating signal (e.g., CLKGA+B) as depicted in FIG. 2e and FIG. 3F or by nesting the subdomain 104 within the domain 103 such that the subdomain 104 has a distinct clock gating signal (CLKG_A+B) that has a component (CLKG_A) in common with domain 103 as depicted in FIG. 2d and FIG. 3d. When during placement it is determined that two or more sub/domains should be merged (or nested), placement can be restarted with the new domain definitions or placement may continue with target conditions employed to force the two sub/domains to be adjacent or to overlap significantly, or to overlap completely into a single relatively high-sink-density domain (or a relatively high-sink-density nest of domains). The forced overlapping of the preliminary sub/domains will then facilitate the logical merger (FIG. 3f) of the two sub/domains into a single distinct new domain 210 having the highest possible sink-density and the lowest possible switching capacitance and power consumption. The combined sinks of the new domain 210 may then be subject to further compression (sink-clustering) in subsequent placement iterations, or by starting the placement over with the new domain definitions.

Figure 3I:
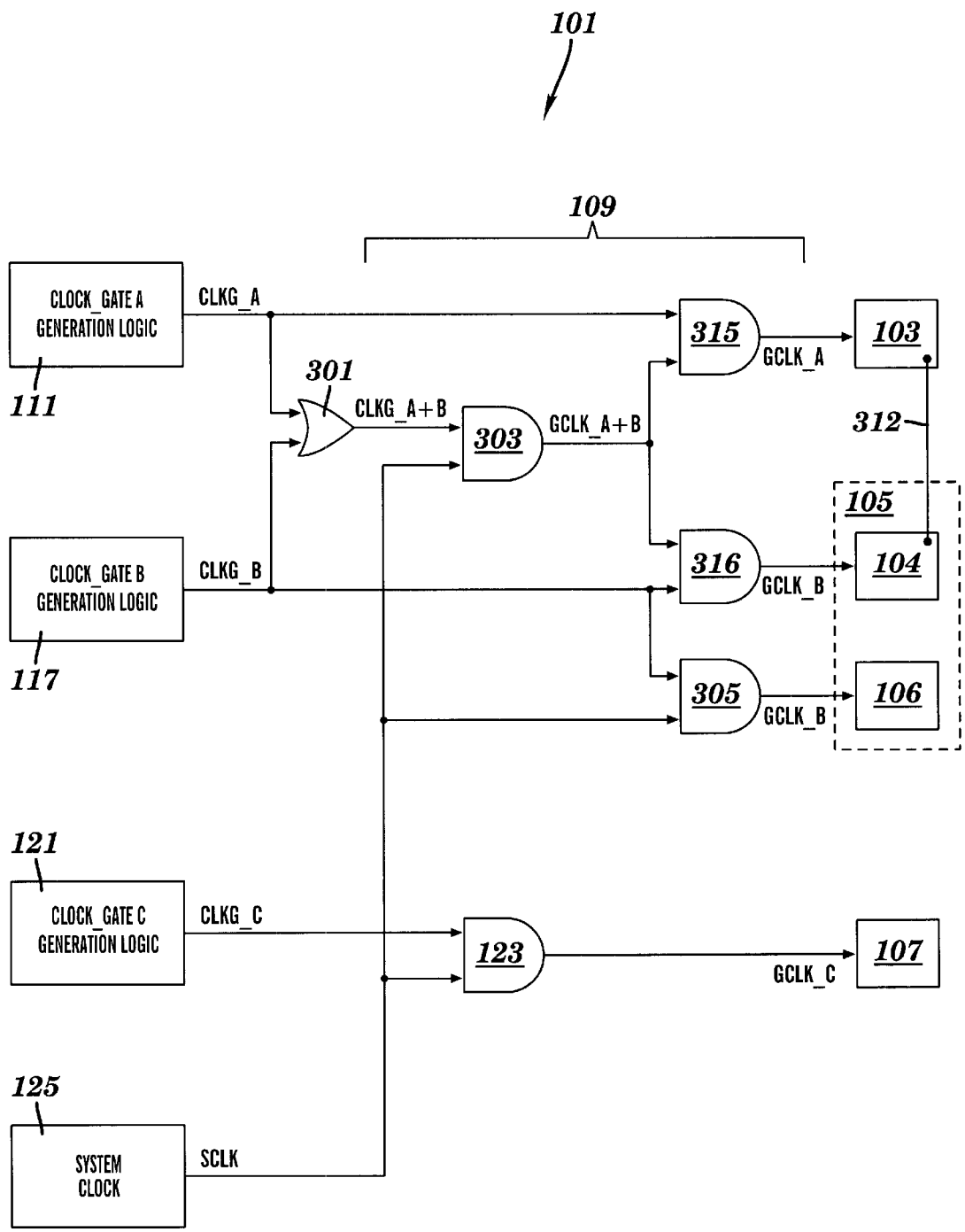
FIG. 3i is a simplified schematic diagram of the integrated circuit design of FIG. 3c with an alternative clock tree design that consumes less power than the clock tree of FIG. 3c.

In some cases, a clock gating signal is used not only to reduce power consumption of the sinks of the domain, but also is required for proper logical operation of the circuit. This alternative use for a clock gating signal (e.g., CLKG_C) is illustrated in FIG. 3e and FIG. 3f and FIG. 3g wherein the clock gating signal is provided to the domain 107 even though the domain is ungated. The clock gating signal may also be provided to a gated domain. In some cases, a portion of the clock tree (e.g. a portion of the nets of a plurality of domains) may be gated differently at different levels, in order to reduce power consumption of the clock tree (e.g., clock tree buffers), while providing necessary gated clock signals at the sinks of each domain. In such cases a second level of clock gating may be used to further gate a gated portion of the clock tree. For example, the merged clock signal GCLK_A+B is gated further by GCLK_A and GLK_B by AND gates 315 and 316 respectively to recover the "pure" gated clocks GCLK_A and GCLK_B, as depicted in FIG. 3i. This creates a hierarchical nesting of clock domains, each of which may be optimized in accordance with embodiments of the invention. While the signal combination and clock signal gating at 301 and 303 in FIG. 3i does not reduce the power dissipated in the clock sink circuits in 103 and 104, it does reduce the switching, and hence the power consumption, within the clock tree itself (e.g., by the buffers of the clock tree not shown in the simplified diagrams of FIG. 3i; See an exemplary real clock tree example in FIG. 2f) In particular, the gated clock signal GCLK_A+B switches (the clock tree's buffers) less than the ungated clock signal SCLK would if it were routed (ungated) to gates 315 and 316. The methods of the present invention can be employed to bring separately gated domains 103 and 104 into close or overlapping cluster, thereby bringing parts of their nets into proximity together such that portions of their nets may be efficiently gated as depicted in FIG. 3i. Therefore, FIG. 3i illustrates a case where the methods of the present invention may be employed to provide optimized clock tree power consumption, while providing the appropriate and logically necessary clock gating signals to each gated domain.

If a domain is in compliance with its overlap target condition, the weight of its net would be effectively set to zero, such that its net would have no further influence upon placement, (unless some other target condition remained unsatisfied). Instead of a binary weighting function (weighted or not weighted) the weighting value could be set to some continuous or multiple-step type function whose influence decreased with decreasing domain overlap.

As an alternative to weighting connections or nets, where the placement software will support it, the chip designer could set a weight on individual sinks (e.g., circuit elements) in a domain rather than its connections or nets. This approach could eliminate the need for modeling any initial clock net (e.g., skeleton clock tree) or maintaining a real clock netlist, where avoidance of such is desirable or necessary. The final clock netlist could be developed and optimized after all logic circuit placement is completed. In practice, non-zero weight would be set on the sinks of a domain that are within a part of a domain region that overlaps another domain's region. Since costs are associated with cuts in a cut-based placer, the effect of these sink-weights would be translated into penalties for cutting nets. This would be done by penalizing cuts which further separate sinks in the overlap part of the domain's region from the adjacent non-overlapped part of the same domain's region. Meanwhile, cuts on the net falling between sinks that are all within the non-overlapped region could be freely made without penalty. For example, assume that the sinks of a first clock domain have been separated by placement into cells A, B, C, D and E, arranged as follows (A and B and E in horizontal sequence; A above C; B above D):

| A | B | E |
|---|---|---|
| C | D | |

Further assume that the first clock domain overlaps one or more other clock domain(s), but only in cell E (i.e. only cell E contains sinks of both the first and second clock domains), and that the next cut made within cell E will be a vertical one, separating cell E into right and left sides ER and EL, respectively. In that case, the sink-weighting approach would penalize any partitioning of the first domain's sinks in E which placed some of these sinks in ER, since that would add an additional cut between the sinks in ER and the sinks within the non-overlapped cells A, B, C and D. By contrast, if a cut were made separating region A into AR and AL, there would be no penalty for placing some of the sinks in cell A in each of these new regions AR and AL (i.e., separating by the new cut in cell A). The general practice of using penalties to control partitioning is described in U.S. Pat. No. 5,963,728 issued to Hathaway et als, which is incorporated herein by reference.

Another embodiment of the invention would be to establish a target condition that is a limit on the degree or number of the crossings of wires of differently-gated clock signals. A variation of this embodiment may include limitations on the crossing of wires carrying a particular other clock signal with wires carrying any other or a particular other clock signal. The placement software could be programmed or augmented with subroutines to detect the extent that wires carrying particular clock signals are crossed by wires carrying other clock signals. Particular connections and wires or certain categories of wires, such as wires near the root (i.e., system clock) of the clock tree, or near the leaves (i.e., sinks) of the clock tree may be forbidden to cross. Enforcing such a target condition prescribing a limitation on such crossing wires may have a beneficial impact on capacitance and wireability within domains having non-zero overlap upon other domains or subdomains.

In some embodiments of the invention two or more target conditions, such as for example, sink-density target conditions and domain overlap target conditions, may be enforced concurrently, conditionally, alternatively or sequentially. For example, if placement conforms a particular domain to a very high sink-density target condition before placement conforms any domain to a particular overlap target condition, the designer might elect (or program the software) to disable or waive an overlap target condition of that dense domain. Similarly, if placement conforms to a favored overlap target condition value with no wireability, skew or delay problems, the designer might elect (or program the software) to disable or waive conformity with a sink-density target condition, conformity with which would introduce such problems, or result in the splitting of the integral domain.

In a further embodiment of the invention, a maximum (switching) capacitance target condition would be established for a domain such that each domain's effective switching capacitance would be estimated and/or computed based upon available placement information, and if such switching capacitance was more than a maximum target value, (e.g., based on an estimated or computed theoretical minimum), the placement of logic circuits (including the sinks of the domain) would be directed in accordance with the lowest-capacitance placement that would not result in an inoperative or unreliable circuits. Alternatively, after-placement optimization techniques of the related art, such as that of Dean et als, could be employed during placement to determine whether maximal optimization could be obtained by re-defining the clock-gating signals, domains and/or subdomains of the circuit before further placement is made.

Because a placement program such as Cplace™ can provide real placement information during the placement process, it is possible to estimate or compute RC values of clock nets of particular domains and subdomains and to estimate the switching capacitance of that domain or subdomain under ordinary circuit operation even before a subsequent placement decision is made. This RC and switching capacitance information may be used to determine a domain or subdomain's compliance with a maximum domain-capacitance target condition. If a domain is not in compliance with a maximum capacitance target condition, the techniques described above for reducing capacitance, such as by clustering its sinks, and/or by reducing overlap, and other techniques practicable by persons skilled in the art could be employed so that placement results in a domain and/or a plurality of subdomains that are jointly or severally in compliance with the applicable maximum capacitance target condition(s).

Where it is desirable or necessary to maintain a netlist of the connections and nets within the clock tree during the placement process, an initial clock tree could be modeled as a skeleton clock tree (212 and FIG. 2g) or other simplified clock tree, and then refined as more information about the clock tree is obtained, until a clock tree having real fanout and the appropriate number and placement of gates (e.g., FIG.2f) is developed and a final clock netlist created 217. In such embodiments of the invention, the clock tree's netlist is developed and refined at the same time that placement is proceeding, thereby providing real information (e.g., RC and wiring information) about the clock tree during placement. Accordingly, the steps of one embodiment of the invention may comprise:

STEP 1: Modeling a clock tree (which may begin as a skeleton clock tree (e.g., FIG.2g) modeled in the netlist of the logic circuit);

STEP 2: Setting a target condition (which may be a sink-density target condition) for one or more domains;

STEP 3: Before performing a placement step (e.g., a min-cut partition), adjusting a weighting factor for a clock net according to compliance with a target condition;

STEP 4: Performing a placement step (which may include a bi-partitioning cut);

STEP 5: After each placement step, refining the clock tree's model, (which may include modifying the clock net's netlist by copying clock gates and moving clock gates to the appropriate level of the clock tree 216).

Steps 1 and 2 may be each performed once, before placement starts, or may be adjusted upon a restart of placement based upon knowledge gained during a prior placement attempt. Steps 3, 4 and 5 may be performed repeatedly as placement proceeds. Placement Step 4 may be a partitioning step or any other placement step which may be performed according to the particular placement algorithm being used. More details on each of these steps follows:

Step 1: We first create a skeleton clock tree, such as illustrated in FIG. 2g, in which there exist no two equivalent parallel clock gates, splitters, or buffers. The skeleton clock tree will have the desired number of stages. As a first illustrative example, an ungated three level skeleton clock tree feeding 20,000 latches would have one first level clock buffer feeding a single second level clock buffer which in turn feeds a single third level clock buffer which in turn feeds all 20,000 latches. Parallel copies of clock tree elements will be created as needed during the placement and clock optimization process.

In a skeleton of a gated clock tree, any gating signals will be introduced at the lowest level (closest to the sinks, "the leaves" of the clock tree) at which we would except a single copy of the clock gate to be physically able to feed a properly re-powered sub-tree containing all the sinks which are to be clocked by the resultant gated clock signal. For example, assume we expect a fanout of 10 for each clock buffer and each clock gate, and we have 800 sinks to be fed by a particular gated clock signal, along with 7000 other sinks to be fed by ungated clock signals. Our overall clock tree then requires 4 stages (because 4 is the smallest power of 10 greater than 7800) and the gated sub-tree requires 3 stages (because 3 is the smallest power of 10 greater than 800). So our skeleton clock tree would have a single first level buffer which feeds both a second level buffer and a clock gate. Both the second level clock buffer and the clock gate would each feed a third level buffer each of which would in turn feed a single 4th level buffer, which would in turn feed the 7000 ungated latches and the 800 gated latches, respectively. Where there are multiple domains, there will be multiple clock-to-sink paths. The ideal skeleton clock tree, like an ideal real clock tree design, has the same number of buffers/gates in all gate-to-sink paths.

In a real clock tree design (e.g., FIG. 2f) the fanout at each buffer or gate is usually not constant, but the basic concept is the same. The skeleton clock tree FIG. 2g has many fewer elements (buffers, splitters, and gates) than will appear in the actual final clock tree. To account for the real space that will be occupied by these omitted elements the designer may artificially inflate the size of the clock sinks as presented to the placement program. The sum of the clock sinks size inflation factors may equal the estimated area that will be required to create the necessary parallel copies of the clock tree elements. Alternatively, the designer could include in the netlist a number of dummy objects that the placement program can manipulate. Chip designers may provide a sufficient number of dummy objects in the netlist to leave room for the clock signal buffers and clock gates which shall be provided in the final netlist that will include all clock tree components such as buffers and gates.

Step 2: A target condition will be established, such as for example a sink-density target condition. This target condition value can be prescribed by the human chip designer or generated automatically by software. A useful target sink-density benchmark can be obtained by computing the sink density of the circuit with an ungated clock tree. To determine this density we find the total number of sinks (e.g., latches) fed by the clock and the total area of the placement region(s) in which these latches will be placed. If the design includes large arrays or hard cores, these would normally be excluded from this total area. The ratio of sinks-to-area gives a useful reference for establishing a sink density target. If we want to try to force closer clustering of the sinks we can increase the target density somewhat, and if we want to relax the clustering requirement (allowing slightly more clock wiring and capacitance in order to reduce the constraints on placement and/or wireability) we can decrease the target density.

Step 3: Before each placement refinement (e.g., min-cut partitioning) step is performed a determination each domain's compliance with a target condition is made, such as for example by computing the actual sink-density of each clock domain. This may be done by dividing the number of sinks in the clock domain by the total area of all placement partition cells (i.e., bins) containing those sinks. If the measured density for a domain is less than the target density, the domain's leaf level net weighting used by the placement program is set to some high value, meaning that the placement program should try to keep the sinks in the domain clustered together. If the density for the domain is greater than or equal to the target density, the net weight is set to some low value, meaning that the placement program need not try to force the sinks any closer together.

If the placement program does not use numerical weights, other techniques may be used to adjust the influence of particular connections. For example, the chip designer may temporarily delete the connection or net (in the placement model) so that the connection or net has no influence on placement. Conversely, before the target sink density is reached, the chip designer might add multiple copies of a connection or net to increase the influence of that connection or net. The chip designer may also choose to have a smooth rather than an abruptly discontinuous change in weighting of these connections as the latch density varies. For example, the chip designer can have the software program compute the ratio between the actual sink density and the target sink density and have the net's weight varied according to some smoothly decreasing function of that ratio.

Step 4: Placement (e.g., bi-partitioning) is performed in accordance with the algorithm (e.g., min-cut partitioning algorithm) of the placement program (e.g. Cplace).

Step 5: After each cut (i.e., each iteration of the placement/partitioning program) modifications to the clock tree model (and netlist) are made according to whether or not each clock domain is still integral, (i.e., whether all the placement partition regions containing the sinks of that domain are adjacent and/or contiguous) or whether the domain has been split into separated subdomains. If the domain has been split, the clock tree net model of the domain may be divided such that the region of each new sub-domain is driven by a separate gate. See e.g., 118, 120 in FIG. 3c. Separate gates 118 and 120 are produced by creating one or more copies of the clock gate 119 feeding the domain, so that each new subdomain (104 & 106 in FIG. 2a-ii and FIG. 3c) is fed by a separate clock gate having the same logical operation as the original. Finally, we will move these clock gates within the tree (toward the sinks) to the correct level to feed the latches in the sub-domain. See, e.g., FIG. 2g. Determination of the proper level may be done as described in step 1.

After each placement/partitioning step (i.e., Step 4), the after-placement clock tree optimization methods of the related art such as those of Dean et als. can be performed to determine whether and how to separately gate each sub/domain (i.e., a domain or subdomain), or whether some sub/domains should be nested (FIG. 2d & FIG. 3d) in or merged with (FIG. 2e & FIG.3g) other sub/domains to reduce power consumption.

In some circumstances, an optimal circuit design may contain a "nested" clock domain or subdomain (e.g. 104 in FIG.3d), nested within another domain (e.g. 103 in FIG.3d) or subdomain. A so-called nested sub/domain (i.e., domain or subdomain) may be either equally active, more active or less active than the higher level domain whose region it is within, adjacent to or overlaps upon, but will have at least one clock gating signal component in common with the higher level domain. A "nested" subdomain may be a subdomain that has the same clock gating signal as the higher level domain (e.g., a nested subdomain that is a subdomain of its own parent domain and nested within that parent domain). Sub/domains are merely "overlapping," (e.g. FIG. 2a-ii) rather than "nested" (e.g., FIG. 2d), if their regions overlap but they do not have ay clock gating signal component in common. In the case where a nested domain is less active than the higher level domain, the clock sinks of the higher level domain may have their clock gated ON whenever signal X is true, while a subset of sinks in the region of the higher level domain, (e.g., the sinks of the less active nested domain) may have their clock signal gated ON only when signals X and Y are both true. In this case the physical region of the higher level domain "X" (controlled by a clock gated by only signal X) could contain sinks of a nested domain or subdomain "XY" controlled by a clock gated open only by signal X ANDed with Y. Conversely, where a nested domain is more active than the higher level domain whose region it occupies, the clock sinks of the higher level domain may have their clock gated ON whenever signal A is true, while the sinks of the nested domain in same physical region have their clock signal gated ON whenever signals A or B are true. In this case, the region of the higher level domain "A" (activated only by signal A) would include a nested domain or subdomain "A+B" controlled by a clock signal gated ON by signal A ORed with signal B.

The inventive method can be applied to nested domains and nested subdomains, and when considering the placement of sinks of the higher level domain containing the nested domain or subdomain, the higher level domain may be defined to include the sinks of the nested domain or subdomain. While the higher level domain will have one or more associated target conditions, the nested sub/domain may also concurrently have a distinct set of one or more target conditions, such that, for example, the sinks of the nested subdomain (i.e., domain or subdomain) might be forced into a cluster having a sink-density higher than that of the whole higher level domain. Where the nested sub/domain is a subdomain of the higher level domain that it is nested within, the present invention can optimize the domain by compressing the sinks of the subdomain into a sub-region having a higher sink-density than the region of the whole domain. An extension to the placement software of the present invention could be coded to identify that portion of the sinks (a subdomain) of the domain which can be compressed together more densely than the remainder of the sinks of the domain. Separate sink-density target conditions may be assigned to each subdomain so defined, and this may result in further reduction of the capacitance of the whole domain's clock net. In this manner, a portion of the sinks of an intact domain may have a higher sink density than the adjacent remainder. An iterative application of this approach could result in a domain having a core of densely packed sinks, and a periphery of less-densely packed sinks. Mathematical algorithms (e.g., differential equations and/or calculus) can be applied to compute the optimal arrangement of high-density and low-density sinks, in order to provide a domain having the lowest capacitance theoretically possible. A bulls-eye type configuration (not necessarily circular, e.g., may be oblong, or irregular shaped, or triangular, rectangular, hexagonal, setpagonal etc.) with the highest sink density in the central area and the lowest sink-density at the edges may provide an optimal density-distribution domain from a wiring/capacitance perspective. It is believed that sinks having external connections should be located at or near the peripheral edge nearest to the external circuit to be connected to. A plurality of such distributed-density domains, each having the same or a compatible number of external connections to other domains might be arranged in the manner of a dense-pack crystal lattice to reduce the wiring distances (and capacitance of the wiring) between them, where physical properties of each logic block will permit this.

As previously noted, the clock tree sinks can produce a large proportion of all heat released within an integrated circuit during operation. The lowest-capacitance (e.g., highest-sink density) domains produced by employing the methods of the present invention may also produce relatively high heat-release per area in certain high-sink-density domains and/or certain portions of the region of a domain. The methods of the present invention may be also be employed to optimize heat-release distribution and heat-dissipation properties of the integrated circuit.

An upper bound on sink-density (e.g., a maximum-sink-density target condition) may be prescribed so that heat generation does not exceed the chip or chip-package's heat-release distribution and heat dissipation limitations (i.e., for avoidance of "hot-spots").

The optimal distribution of particular sinks within a given domain could also be established (by intelligently defining subdomains) to conform the heat-release generation pattern of the domain (including the heat released by the clock sinks and by the logic circuits within the domain during operation) to the thermodynamic properties and/or limitations of the heat-dissipation medium to be relied upon. In such a case, subdomains might be defined with consideration to the quantity of heat that each sink and its closely-connected logic circuitry will release per unit of semiconductor chip area. A thermodynamically well-balanced domain might distribute high-heat generating sinks/circuits amidst low-heat generating sinks/circuits to avoid an excessive concentration of high-heat generating sinks/circuits in a particular (e.g., a high sink-density core) sub-region. A minimum-overlap condition might be used instead of or in conjunction with a maximum-sink-density target condition, to "dilute" a high-density "hot" subdomain with the sinks and associated circuitry of a "cooler" subdomain. For a heatwise homogeneous region or a portion of a domain's region (i.e., having approximately equal heat-generation per unit area), a plurality of subdomains (e.g., having zero-overlap target conditions relative to other subdomains of the same domain) may be defined to include a combination of sinks and associated circuitry, such that all subdomains (or only a subset, such as the highest heat-density or sink-density subdomains) have a particular ratio of heat generation/per unit area approximately equal to a prescribed value. Time multiplexing of activity of heat-releasing sinks/circuits may also be employed to reduce peak heat release in a particular sub-region: for example, the sinks of a second domain that is active (releasing heat) at times other than when the first domain is active (releasing heat), may be allowed to overlap the first domain's region, while a third domain that is active (releasing heat) at the same time as the first may be prohibited from overlapping, by appropriate overlap target conditions. Skillful heat-release management of regions and sub-regions by use of the methods of the present invention can lead to the production of integrated circuits having superior released-heat distribution properties, such that they are more reliable in operation, and/or they require less expensive heat-dissipating packaging or external heat-dissipating apparatus due to the controlled distribution of the heat-generating clock sinks and connected circuitry which can account for up to 80 percent of all heat released (i.e., electrical energy consumed) within a given IC. Therefore the methods of the present invention can not only reduce the total heat released by the integrated circuit (by controlling the switching frequency and capacitance of nets of domains the optimally gated clock tree), but can also improving the low-power integrated circuit further by limiting the peak heat-release concentrations at any region on the integrated circuit.

The inventive method may be used to exclude domains and subdomains, for example, nested sub/domains, from where they are undesirable, by setting an overlap target condition of one sub/domain relative to the other to zero or to some small value compatible with wireability, delay, etc. For example, where it is desired to have no switching activity of a more-active nested domain within the region of a higher level domain when the higher level domain is gated off, setting an appropriate overlap target condition to zero may force the sinks of the more active domain entirely out of the region of the higher level domain. Thus, skillful use of the methods of the present invention could enable the chip designer to bring all sinks controlled by a given clock gating signal together in one area on the chip (for example, near to the clock gate) while specifying the degree of separation/overlap between sinks of adjacent or nested sub/domains. The ability to exclude subdomains from one another may also be used to separate and sort higher-density subdomains from lower-density subdomains.

An overlap target condition of a particular domain could also be established for areas defined other than by reference to regions occupied by other clock domains. For example, a particular domain's overlap target condition might attempt to force the domain out of or into a particular area on the surface of the chip. In this fashion, the methods of the present invention may be used to "herd" the sinks of a particular domain out of particular "pastures" (i.e. certain territories of the chip) such as pastures occupied by certain other herds/domains, while leaving them free to enter, or compelling them to enter, other pastures. And by employing sink-density target conditions either concurrently or sequentially with overlap target conditions, the sinks of a particular domain may be rounded up into relatively dense clusters (herds), either intermixed with or isolated from herds of sinks of particular other domains. Skillful use of the methods of the present invention could enable the chip designer to cluster all the sinks of a particular domain into one or more finite and predetermined areas on the surface of the chip.

The pending Patent Application of Dean discloses the below set forth after-placement-type clock tree optimization methods which may be used in conjunction of the method of the present invention to redefine domains and/or optimize the clock structures and definitions of domains and subdomains.

Figure 4:
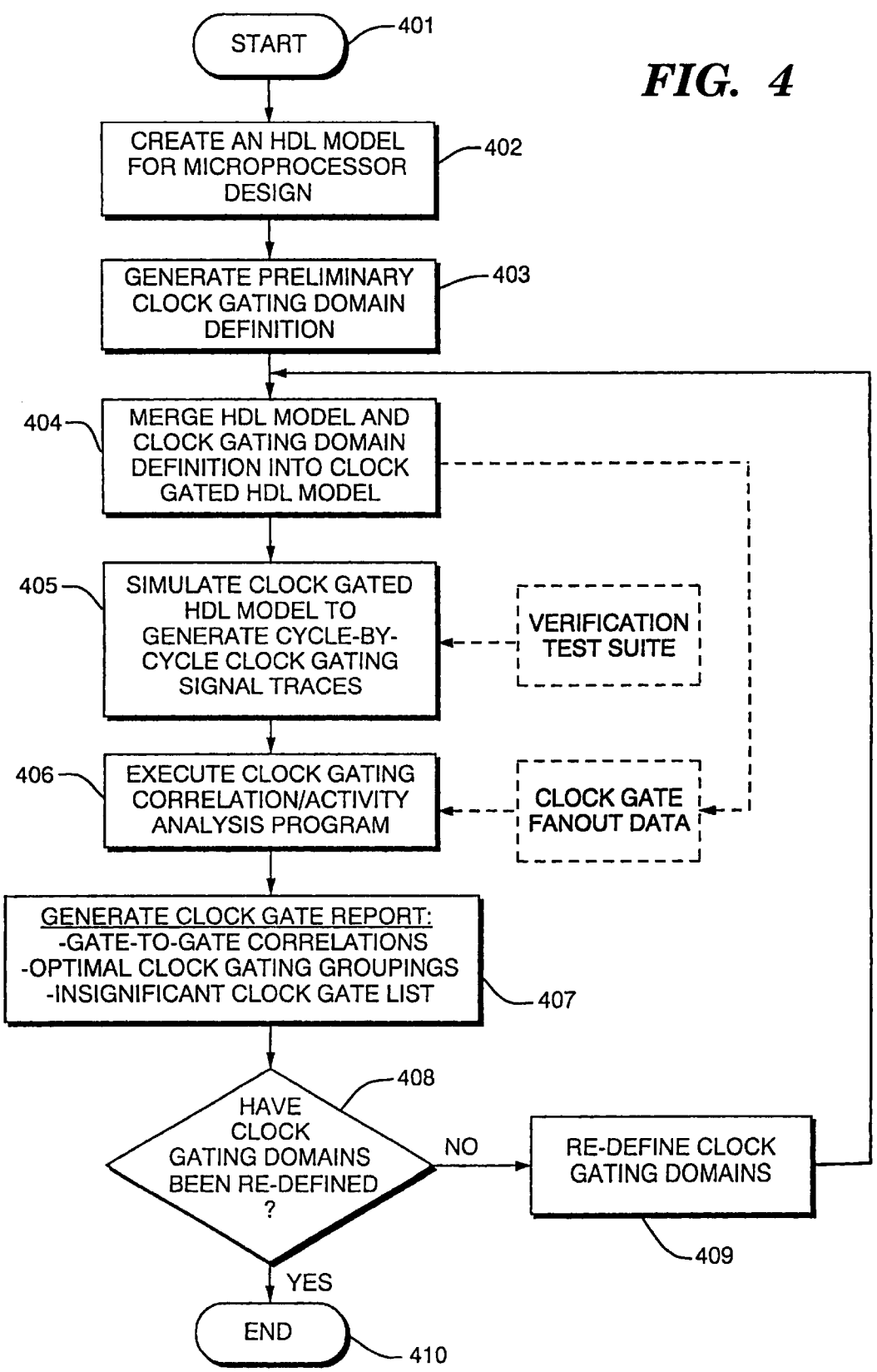
FIG. 4 is a flowchart of a clock gating methodology for improving the clock gating efficiency of low power clock signal distribution networks.

FIG. 4 is a flowchart of a clock gating methodology 400 for improving the clock gating efficiency of low power clock signal distribution networks. For example, the clock gating methodology 400 may be used to generate the reduced power consumption microprocessor design 101 of FIG. 3 based on the original design of FIG. 1.

The clock gating methodology 400 starts at step 401. In step 402, a high-level design language (HDL) model of a microprocessor design is created. Any suitable HDL model may be employed, such as Verilog® by Cadence Design Systems, Inc. or VHDL. A preliminary definition of clock gating domains (e.g., clock gating for the logic blocks 103–107 of FIG. 1) then is generated in step 403. The preliminary clock gating domain definition process typically is performed manually, based on logic block functionality, by an engineer having knowledge of the microprocessor architecture. In step 404, the HDL model of the microprocessor design and the preliminary definition of clock gating domains are merged into a clock gated HDL model for the microprocessor design.

In step 405, the clock gated HDL model for the microprocessor design is simulated in a logic simulator (e.g., Verilog® XL by Cadence Design Systems, Inc.) with real vectors representative of the operating environment of the design. A verification test suite may be used for this purpose (e.g., various functional patterns or simulation vectors which together comprise a representative sample of typical operating instructions or programs that are likely to execute on the microprocessor). The outputs of the logic simulation of the clock gated HDL model for the microprocessor design are cycle-by-cycle traces of all the microprocessor's clock gating signals.

In step 406, the cycle-by-cycle clock gating signal traces output by the logic simulator and clock gate fanout data (e.g., the number of loads that a net drives) from the original clock gated HDL model for the microprocessor design are passed to a clock gating correlation/activity analysis program. Therein, to assess the effectiveness of the microprocessor design's clock signal distribution network, primarily three factors are considered for each clock gating signal:

1. the clock gating signal's activity (e.g., the percentage of time the clock gating signal gates off the system clock signal);
2. the percentage of latches controlled by the clock gating signal; and
3. the cross-correlation of the clock gating signal with all other clock gating signals within the clock signal distribution network.

By analyzing each of the clock signal distribution network's clock gating signals, clock gating signals that produce little gating and which are inefficient may be eliminated and similar clock gating signals may be combined into one clock gating signal as described below.

The clock gating correlation/activity analysis program begins by parsing the cycle traces of the clock gating signals and by calculating the activity ratio for each signal. The activity ratio for a clock gating signal is determined by calculating the ratio of the on-time of the clock gating signal (e.g., the time when the system clock signal is not gated-off by the clock gating signal) to the entire simulation time.

Figure 5:
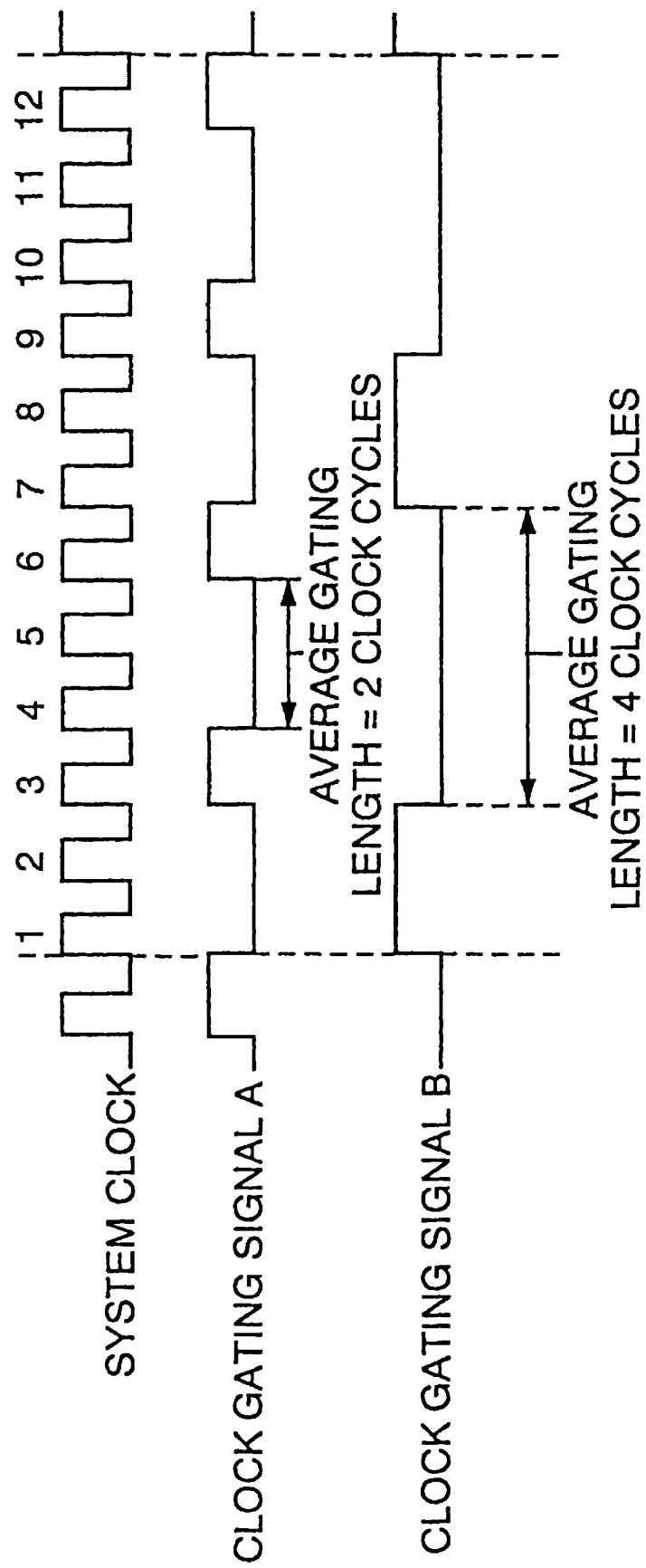
FIG. 5 is an exemplary timing diagram for a system clock signal and clock gating signals useful in explaining average gating length.

In addition to the activity ratio, preferably the average gating length also is computed, for each clock gating signal. Average gating length is the average length, in clock cycles, that a clock gating signal gates off the clock out of the entire simulation period. For example, FIG. 5 shows exemplary system clock and clock gating signals (e.g., clock gating signal A and clock gating signal B) useful in explaining average gating length. With reference to FIG. 5, both clock gating signals A and B have the same activity ratio between times t0 and t1, because both clock gating signals will gate 8 out of 12 clock cycles of the system clock signal and will pass 4 out of 12 clock cycles of the system clock signal. However, because clock gating signal B switches half as many times as clock gating signal A (e.g., clock gating signal B has an average gating length that is twice as long as clock gating signal A's average gating length), the gating due to clock gating signal B can be done with fewer gating logic switches. More specifically, the average gating length for clock gating signal A (AGLA) equals:

$$AGL_A = \frac{2+2+2+2}{4 \text{ TIMES}} = 2$$

and for clock gating signal B (AGLB) equals:

$$AGL_B = \frac{4+4}{2 \text{ TIMES}} = 4.$$

Accordingly, less power is required to implement gating with clock gating signal B than with clock gating signal A. All other factors being equal, clock gating signal A should be eliminated before clock gating signal B based on average gate length considerations to maximize power consumption savings.

Following the activity ratio and/or average gating length calculations, a forward trace is performed for each clock gating signal to determine the percentage of latches out of the total number of latches in the microprocessor design that are controlled by the clock gating signal (i.e., the latch percentage). By combining the activity ratio (and/or the average gating length) and the latch percentage for each clock gating signal, a clock gating signal "usefulness ratio" for each of the clock signal distribution network's clock gate signals is determined.

All clock gating signals having a usefulness ratio lower than a pre-determined ratio (e.g., about 10%) preferably are designated as unnecessary clock gating signals and the AND gates required to generate the gated clock signals therefrom (e.g., the third AND gate 123 of FIG. 1) should be eliminated, if possible, from the clock signal distribution network, or clock gating at the root and middle levels of the tree should be simplified. For example, a clock gating signal that is only active 10% of the time but that controls 40% of the microprocessor design's latches is more useful than a clock gating signal that is active 20% of the time but that controls only 1% of the microprocessor design's latches.

After determining the usefulness ratio for each clock gating signal, the clock gating correlation/activity analysis program performs a cross-correlation calculation between all the clock gating signals of the clock signal distribution network. A matrix of cross-correlations thereby is generated wherein each element in the matrix contains the percentage of time two clock gating signals are identical. The cross-correlation matrix preferably comprises an exhaustive list of all possible comparisons between two clock gating signals of the clock signal distribution network of the microprocessor design.

When the percentage of time two clock gating signals are identical exceeds a predetermined threshold (e.g., 90%), the two clock gating signals are declared essentially equivalent and preferably are combined into one composite clock gating signal (as described below). For example, with reference to FIG. 2c, the first and the second clock gating signals (CLKG_A), (CLKG_B) are identical for 18 out of 19 system clock signal (SCLK) cycles, and therefore have a cross-correlation percentage of 95%. However, the first and the third clock gating signals (CLKG_A), (CLKG_C), while identical for 6 out of the 19 system clock signal (SCLK) cycles, would only gate one out of the 19 clock cycles if combined, and have a cross-correlation percentage of 37%. Accordingly, the first and the second clock gating signals (CLKG_A), (CLKG_B) should be combined while the first and the third clock gating signals (CLKG_A), (CLKG_C) should not be combined.

Once cross-correlation factors are generated for all the clock gating signals, "clock gate domains" are generated. Each clock gate domain comprises two or more clock gating signals that have a cross-correlation percentage greater than a predetermined threshold (e.g., 90%). As the size of each clock gate domain increases, the number of required clock gate domains decreases and the simpler the clock signal distribution network becomes (e.g., requiring less control unit logic and fewer AND gates so as to affect a smaller chip area and less power consumption for the microprocessor design). The simpler tree also will be easier to route and thus will consume less power.

After the clock gating correlation/activity analysis program is completed, a clock gating report is generated in step 407 as described below with reference to FIG. 6. Thereafter, the clock gating methodology 400 may end in step 410, but preferably, in step 408, a determination is made as to whether the clock gating domains have been redefined. If not, in step 409, the clock gating domains are automatically redefined based on the clock gating report to improve the efficiency of the clock signal distribution network. Steps 404–406 then are repeated to analyze a clock gated HDL model embodying the re-defined clock gating domains. A new clock gating report is generated in step 407 and the clock gating methodology 400 ends in step 410.

FIG. 6 is an exemplary clock gating report 601 generated by the clock gating methodology 400 of FIG. 4 based on the microprocessor design 101 of FIG. 1. The clock gating report 601 comprises a general report information section 603 that lists general information such as the number of clock gating signals (e.g., 3), the number of vectors analyzed (e.g., 57) and a file name for storing activity information (e.g., clock-domain.act). The clock gating report 601 further comprises an analysis section 605 that provides the activity ratio, the latch percentage and the usefulness ratio for each clock gating signal (CLKG_A), (CLKG_B) and (CLKG_C) of FIG. 2c. Preferably the average gating length also is listed (not shown). The pre-determined usefulness ratio threshold (below which a clock gating signal is designated as not useful) is shown to be "5" within the analysis section 605 of FIG. 6, and the third clock gating signal (CLKG_C) is displayed as a clock gating signal having a usefulness ratio threshold below the predetermined usefulness ratio threshold (e.g., the third clock gating signal (CLKG_C) preferably is eliminated).

The clock gating report 601 also comprises a correlated clock gate domain section 607 that identifies a file name for storing clock gate domain information (e.g., clock-domains.cor), the minimum percentage of time two clock gating signals must be identical to be placed within a clock gate domain (e.g., 0.9) and the identity of any clock gating signals that can be placed within a single clock gate domain (e.g., the first and the second clock gating signals (CLKG_A), (CLKG_B)). The correlated clock gate domain section 607 also comprises a correlation matrix 609 that contains the percentage of time each clock gating signal is identical to every other clock gating signal within the clock signal distribution network.

By employing the clock gating report 601, an engineer can identify which clock gating signals should be combined and which clock gating signals should be eliminated to optimize the efficiency of a clock signal distribution network. The smallest number of clock gates thereby may be employed that yield the maximum amount of clock gating power savings (i.e., the microprocessor design may be clock gate signal optimized).

While the clock gating methodology 400 of FIG. 4 identifies which clock gating signals should be combined and which should be eliminated, a process is still required that ensures the remaining clock gate domains deliver the best physical layout for the clock signal distribution network ("clock tree") based on the placement of the latches and clock-splitters that comprise the clock tree (e.g., to achieve a good balance between the clock gating and the wiring capacitance of the clock tree). Failure to consider the physical layout of a clock tree can result in a heavily clock gated design that consumes more power than a clock tree employing no clock gating (e.g., due to capacitive wiring losses associated with the heavily clock gated design as described below with reference to FIGS. 7–11).

Figure 7:
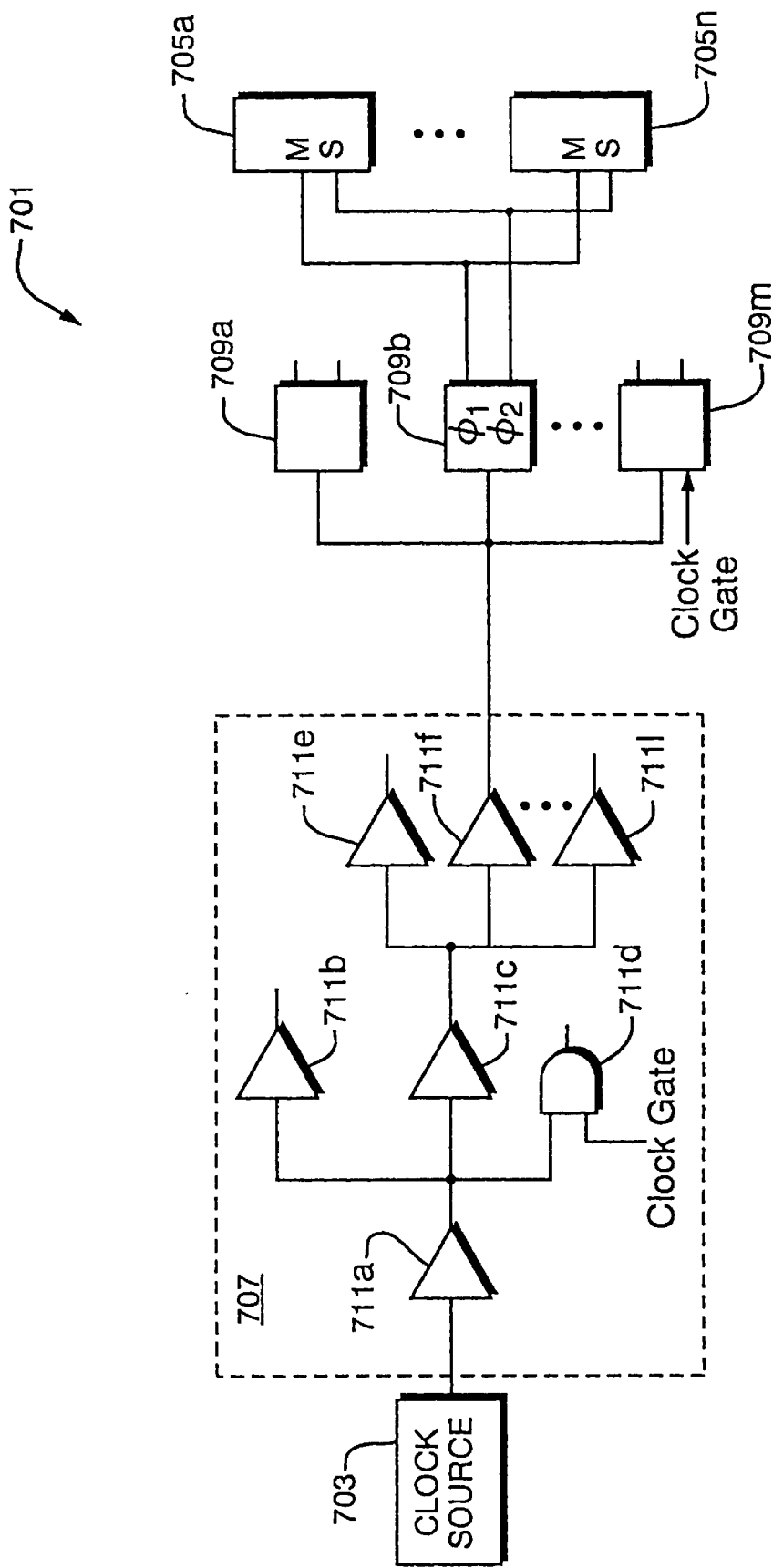
FIG. 7 is a schematic diagram of a typical clock tree.

FIG. 7 is a schematic diagram of a typical clock tree 701. The clock tree 701 comprises a clock source 703 (e.g., a crystal oscillator) coupled to a plurality of latches 705a-n via a repowering tree 707 and, depending on the type of latches being driven, via a plurality of clock splitter circuits ("clock signal splitters") 709a-m. The repowering tree 707 comprises a plurality of clock buffers 711a-l (as shown) amongst which all the clock loads are distributed. Each clock buffer 711a-l may comprise a standard clock buffer (e.g., clock buffers 711a-c or 711e-l) or a gated clock signals buffer (e.g., clock buffer 711d) that serves both the functions of re-driving a clock tree and of logical clock gating.

In operation, the clock source 703 supplies a clock to the repowering tree 707, and the clock buffers 711a-l of the repowering tree 707 distribute all the clock loads required of the plurality of clock signal splitters 709a-m and/or of the plurality of latches 705a-n (e.g., so as not to violate the electrical drive limitations of the clock source 703). Depending on the type of clock being distributed, the repowering tree 707 either can drive the plurality of latches 705a-n directly (for a single phase clock tree not shown) or can drive clock signal splitters such as the plurality of clock signal splitters 709*a*-m which generate dual, out of phase clock signals to drive master/slave latches such as the plurality of latches 705*a*-n (for a dual phase clock tree such as the clock tree 701). Standard, single-phase, clock driven edge-triggered flip flops for use in single phase clock trees are well-known in the art and therefore are not described further herein. The plurality of latches 705*a*-n preferably comprise level sensitive master/slave latches as are known in the art. Clock gating may be performed at any stage of the clock tree 701, from the first buffer 711*a* to the plurality of clock signal splitters 709*a*-m at the "leaves" of the clock tree 701.

Because the physical location of the clock gates and/or latches are unknown during the logic design stage of a clock tree such as the clock tree 701 (e.g., during the clock gating design previously described with reference to FIGS. 1–6), a clock tree may yield low power consumption due to extensive clock gating based on logic model considerations that typically assume unit capacitance for all clock tree wiring connections. However, when real capacitances are extracted from the physical design of the clock tree, the wiring lengths required to implement the clock tree and its associated clock gating may consume more power than that saved by the extensive clock gating. For example, FIG. 8 (i.e., FIGS. 8*a*) is a schematic diagram of a sample clock tree 801 employing clock gating which, due to the physical location of drivers and latches, causes long network wiring lengths and thus large capacitive power losses. The clock tree 801 includes but does not consist essentially of "clusters" of physically proximate sinks (e.g., latches or splitters) on an IC chip represented by reference numbers 803, 805 and 807, respectively. Sinks denoted by "A" represent sinks that are to be gated by a clock gating signal "GATE__A" based on logic model considerations and are therefore said to belong to a clock gated domain A. Sinks denoted by "B" belong to a clock gated domain B. By definition, the gated clock signals for sinks A (GCLK__A) and the gated clock signals for sinks B (GCLK__B) are different and must be driven by separate repowering trees. Accordingly, the sinks A are driven by a first repowering tree 809 and the sinks B by a second repowering tree 811. Gated clock signals for the sinks A and B are supplied from a clock source 813 gated with the clock gating signal GATE__A via gating logic 815 and gated with the clock gating signal GATE__B via gating logic 817, respectively.

The clock tree 801 is inefficient from a power consumption standpoint because of the overlap of the first repowering tree 809 and the second repowering tree 811 in the vicinity of the cluster 803. Because of this overlap, wire connections are required to the cluster 803 from both the GATE__A gating logic 815 and the GATE__B gating logic 817, unlike the cluster 805 and the cluster 807 which require only one wire connection from either the GATE__A gating logic 815 or from the GATE__B gating logic 817 as shown.

Figure 8A:
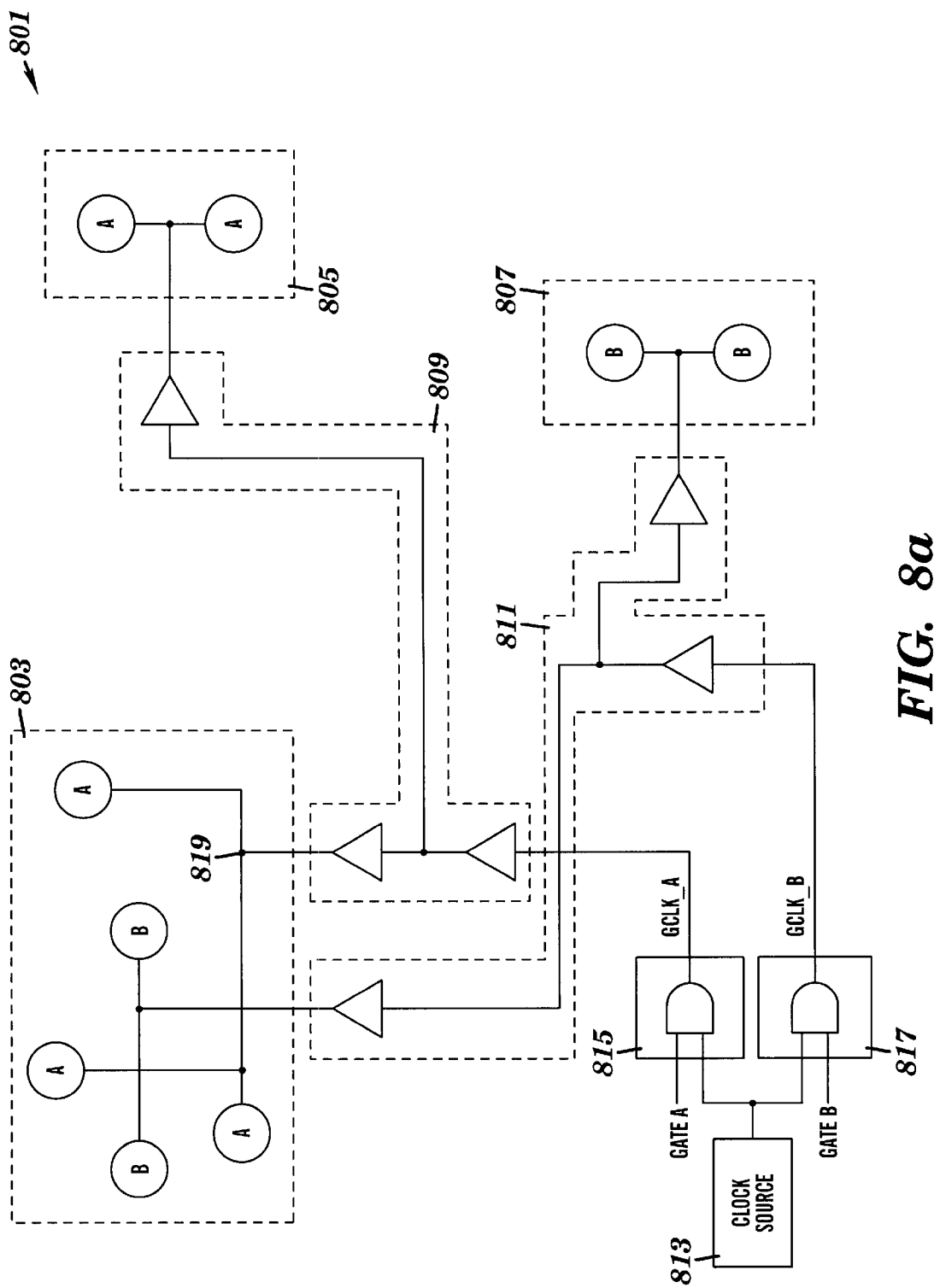
FIG. 8a is a schematic diagram of a sample clock tree of a circuit created using the method of the related art depicted in FIG. 1b, and employing a clock gating which causes long network wiring lengths.
Figure 8B:
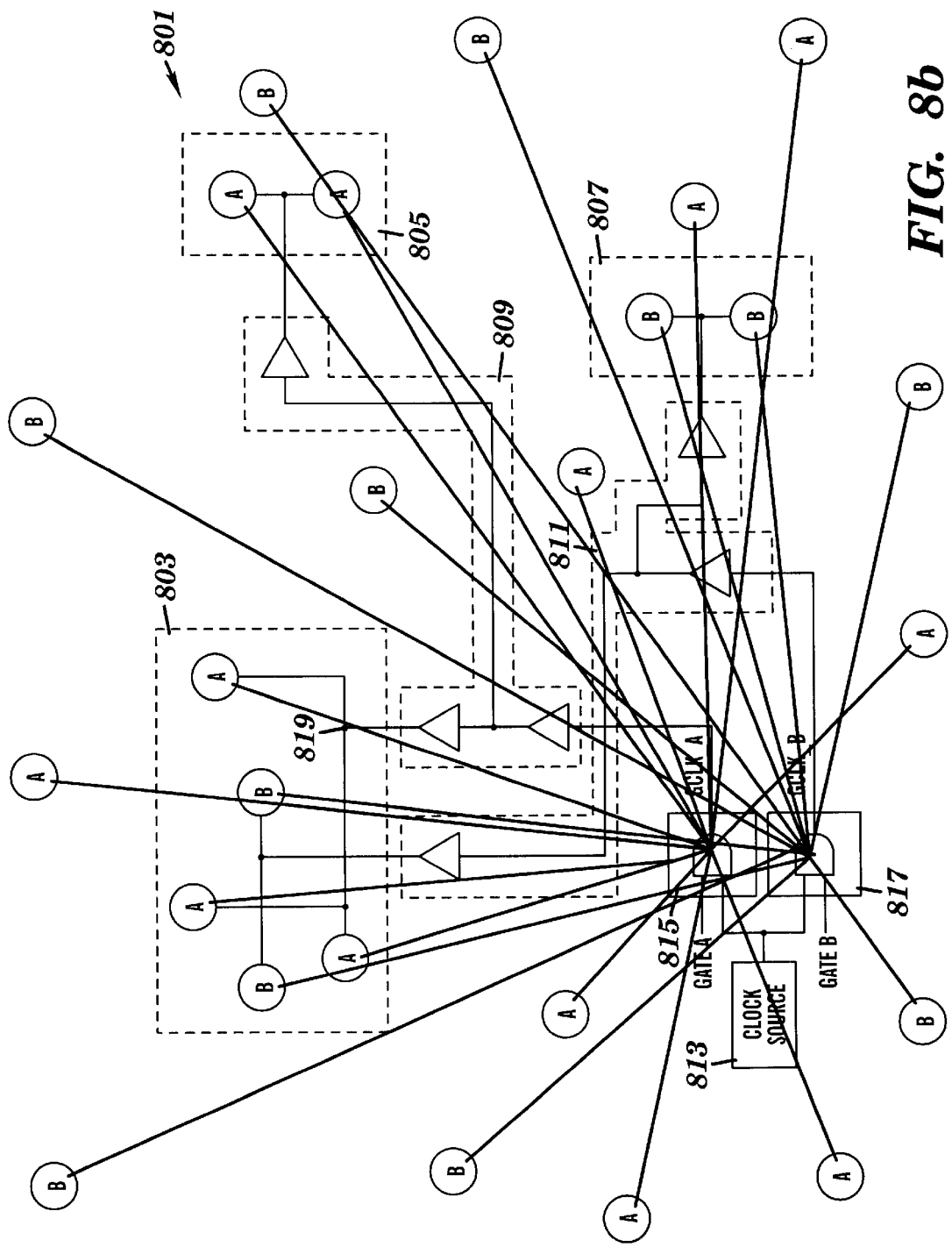
FIG. 8b is the schematic diagram of FIG. 8a augmented with an exemplary illustration of locations of the distributed clock sinks also present in the circuit of FIG. 8a but not shown in FIG. 8a because they are not in "clusters," and overlaid with straight lines from gate-to-sink to further illustrate the non-optimized physical placement of clock sinks on a semiconductor chip of the clock-gated integrated circuit design of FIG. 1a using the method of the related art depicted in FIG. 1b.
Figure 9:
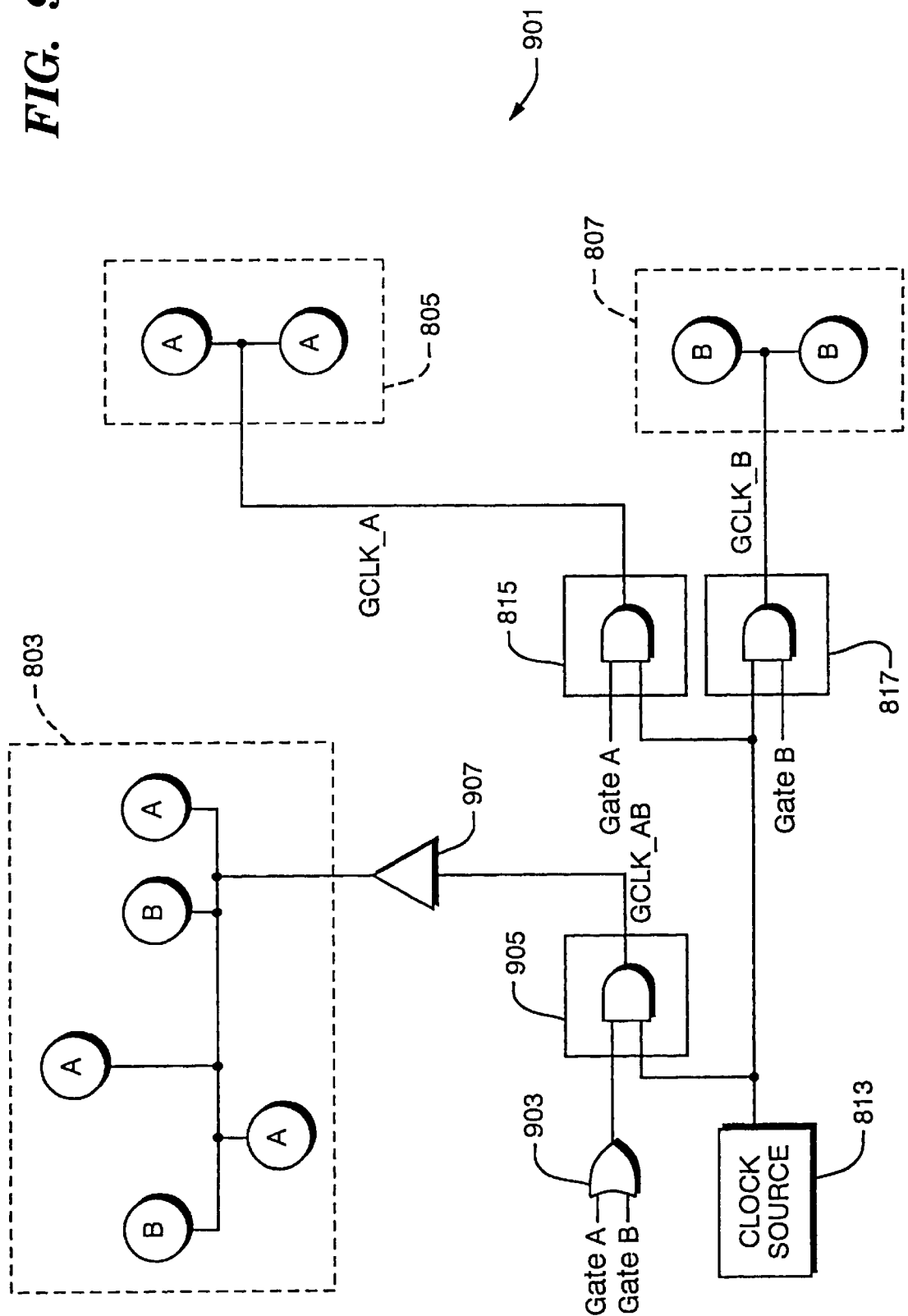

FIG. 9 is a schematic diagram of a clock tree 901 that represents an improvement of the clock tree 801 of FIG. 8*a*. The clock tree 901 comprises the cluster 803, the cluster 805, the cluster 807, the clock source 813 and the GATE__A, GATE__B gating logic 815, 817 of FIG. 8*a*, as shown. However, the cluster 803 is reorganized so that the sinks A and B within the cluster 803 are driven by a single gated clock signal "GCLK__AB". The gated clock signal GCLK__AB is generated by ORing the GATE__A and GATE__B clock gating signals via an OR gate 903 and by gating the clock signal supplied from the clock source 813 with the ORed GATE__A and GATE__B clock gating signals via gating logic 905. A repowering buffer 907 is required to drive all of the sinks A and B within the cluster 803 of FIG. 9.

By employing a single gated clock signal, a significant decrease in wiring length is achieved as only one wiring connection must be made to the cluster 803. Assuming the power consumption savings due to the reduced wiring length within the clock tree 901 exceeds the power consumption savings of having the sinks A and the sinks B within the cluster 803 separately clock gated as in the clock tree 801, the clock tree 901 represents a more efficient clock tree design than the clock tree 801. Therefore, the goal of considering the physical layout in clock gating optimization is to create a clock tree that achieves a good balance between clock gating and wiring capacitance based on such considerations as the amount of physical overlap between clock domain sinks and the correlation between gated clock signals that may be combined. Note that the cluster 805 and the cluster 807 of the clock tree 901 still receive "pure" gated clock signals (e.g., gated clock signals GCLK__A and GCLK__B, respectively) and the maximum power consumption reduction based on clock gating considerations.

Figure 10:
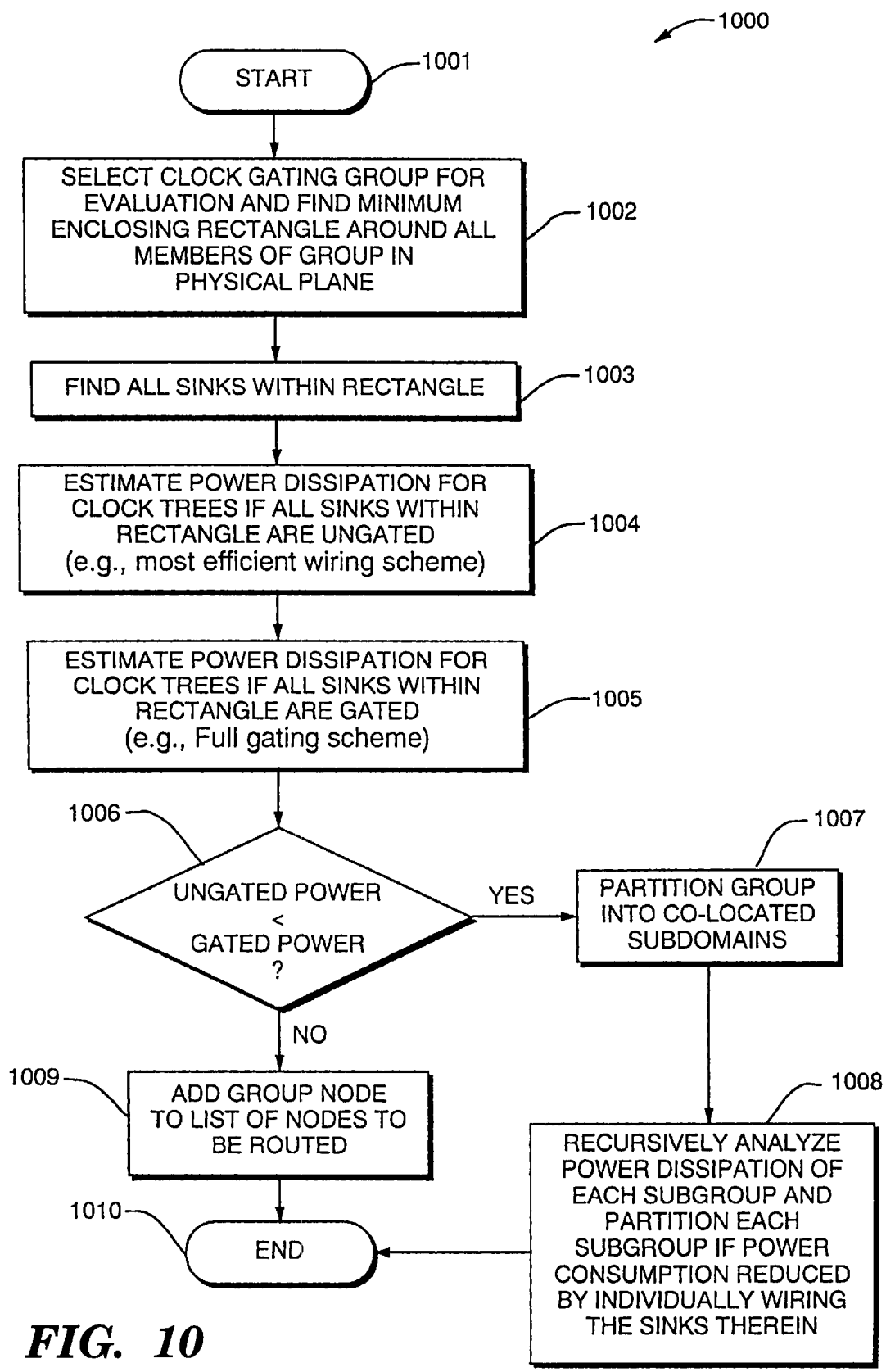
FIG. 10 is a flowchart of an ungate algorithm that optimizes a clock tree design given knowledge of the physical layout of the clock tree of a circuit created using either the method of the related art depicted in FIG. 1b or the method of the present invention.

FIG. 10 is a flowchart of an ungate algorithm 1000 that optimizes a clock tree design based on the physical layout of the clock tree following performance of the clock gating methodology 400 of FIG. 4 (e.g., the methodology that creates clock gate domains based on logical considerations as previously described). In general, the ungate algorithm 1000 is used in conjunction with the physical design algorithm 1100 of FIG. 11 to perform a top-down analysis on the clock tree generated by the clock gating methodology 400 to decide whether to keep the clock gate domains defined therein. Specifically, the ungate algorithm 1000 (in conjunction with the physical design algorithm 1100) works on a fully built clock tree and recursively traverses the tree to break apart gating when doing so reduces the power consumption of the tree. By making gating the default within a clock tree, and by forcing the ungate algorithm 1000 to actively break apart gating domains, gating thereby tends to remain higher in the tree (e.g., closer to the root). The higher up in the tree (closer to the root) that clock gating can be maintained, the closer the physical clock gate domain resembles the logical clock gating model which yields maximum gating of the clock tree. Further, by starting at the root of the tree and working toward the leaves, solutions are avoided that appears better at a lower level within the tree but which are not the best solution when the entire tree is considered (e.g., "local minimum" traps are avoided).

With reference to FIG. 10, the ungate algorithm 1000 starts in step 1001. It is assumed that a logically optimized clock gated clock signals tree has been generated by partitioning the sinks of the tree into clock gate domains in accordance with the clock gating methodology 400, that the clock gating signal activities have been calculated and that the physical locations for the sinks within the clock tree have been determined.

In step 1002, a clock gate domain node of the clock tree (e.g., node 819 in FIG. 8*a*) is selected for evaluation, and a minimum enclosing rectangle is defined around all members of the domain within the physical plane of the clock tree (e.g., the cluster 803). In step 1003, all sinks within the minimum enclosing rectangle are located, including sinks which do not form part of the clock gate domain being analyzed.

In step 1004, the power dissipation for the sinks within the minimum enclosing rectangle is analyzed assuming all of the sinks therein are wired without gating. This represents the minimum wiring capacitance configuration for the sinks within the rectangle. Thereafter, in step 1005 the power dissipation for the sinks within the minimum enclosing rectangle is analyzed assuming the sinks therein are gated in accordance with the clock gating methodology 400. This represents the full gating scheme for the sinks within the rectangle. Steps 1004 and 1005 may be performed in any order.

In step 1006, the power dissipations for the gated and ungated sink configurations are compared. If the power dissipation is reduced by individually wiring the sinks within the domain being analyzed, the domain is partitioned into co-located subdomains in step 1007. Thereafter, in step 1008, the power dissipation for each subdomain is recursively analyzed (e.g., is analyzed with and without gating), and if power consumption is reduced for a subdomain by individually wiring the sinks therein, the subdomain is partitioned. If desired, this process may be repeated until all subdomains have been considered. Thereafter, the analysis for the clock gate domain is complete and the ungate algorithm 1000 ends in step 1010.

If in step 1006, it is determined that the power dissipation for the domain being analyzed is not reduced by individually wiring the sinks within the domain, the domain is not partitioned. Rather, in step 1009 the node of the clock gate domain being analyzed is added to the list of the nodes to be routed with a minimum-skew clock routing optimization program such as IBM's ClockDesigner tool. These tools create an optimal routing of an ungated clock signals tree by rearranging domains of equivalent sinks to minimize capacitance difference and thus to minimize clock skew between different domains. Clock skew is the difference in arrival times of clock nets at different latches in a clock tree and is caused by differences in capacitive load and buffer drive strength of different networks. Clock skew should be minimized as it reduces the effective cycle time left to perform logical operations in a microprocessor design. Note that the node is fed with an ungated clock signals signal. Thereafter, the analysis for the clock gate domain is complete and the ungate algorithm 1000 ends in step 1100. Pseudocode for performing the ungate algorithm 1000 is listed below, written roughly in C code.

```
1   Evaluate_Ungate {GATED(domain)}
2       if size(GATED(domain)) = 1
3           add GATED(domain) to NETLIST;
4           break;
5       BOX = Enclose_box (GATED (domain))
6       UNGATED_POWER = Estimate_ungated_wiring {BOX}
7       GATED_POWER = Estimate_gated_wiring {BOX}
8       if (UNGATED_POWER < GATED_POWER)
9           Subdomains = Ungate_domain {GATED(domain)}
10          for (all Subdomains)
11              Evaluate_Ungate { Subdomains }
12      else
13          Add GATED(domain) head node to NETLIST
```

In statement 1, the ungate algorithm 1000 begins on a gated domain "GATED(domain)". In statements 2, 3 and 4, if the gated domain contains only one sink, the domain cannot be partitioned and the node associated with the domain is added to the netlist of nodes for the clock tree routing. Assuming the gated domain comprises more than one sink, in statement 5 the minimum enclosing rectangle "BOX" is defined for the gated domain.

In statement 6 the power dissipation for the sinks within the minimum enclosing rectangle is analyzed assuming all of the sinks therein are wired without gating; and in statement 7 the power dissipation for the sinks within the minimum enclosing rectangle is analyzed assuming the sinks therein are gated in accordance with the clock gating methodology 400. In statement 8, the power dissipations for the gated and ungated sink configurations are compared. If the power dissipation is reduced by individually wiring the sinks within the domain being analyzed, the domain is partitioned into co-located subdomains in statement 9. Thereafter, in statements 10 and 11 the power dissipation for each subdomain is recursively analyzed, and if power consumption is reduced for a subdomain by partitioning the subdomain, the subdomain is partitioned.

If the power dissipation is not reduced by individually wiring the sinks within the domain being analyzed, in statements 12 and 13 the domain is not partitioned and the node of the clock gate domain being analyzed is added to the netlist of the nodes for the clock routing tool being employed, with a gating buffer at the head of the node.

Figure 11:
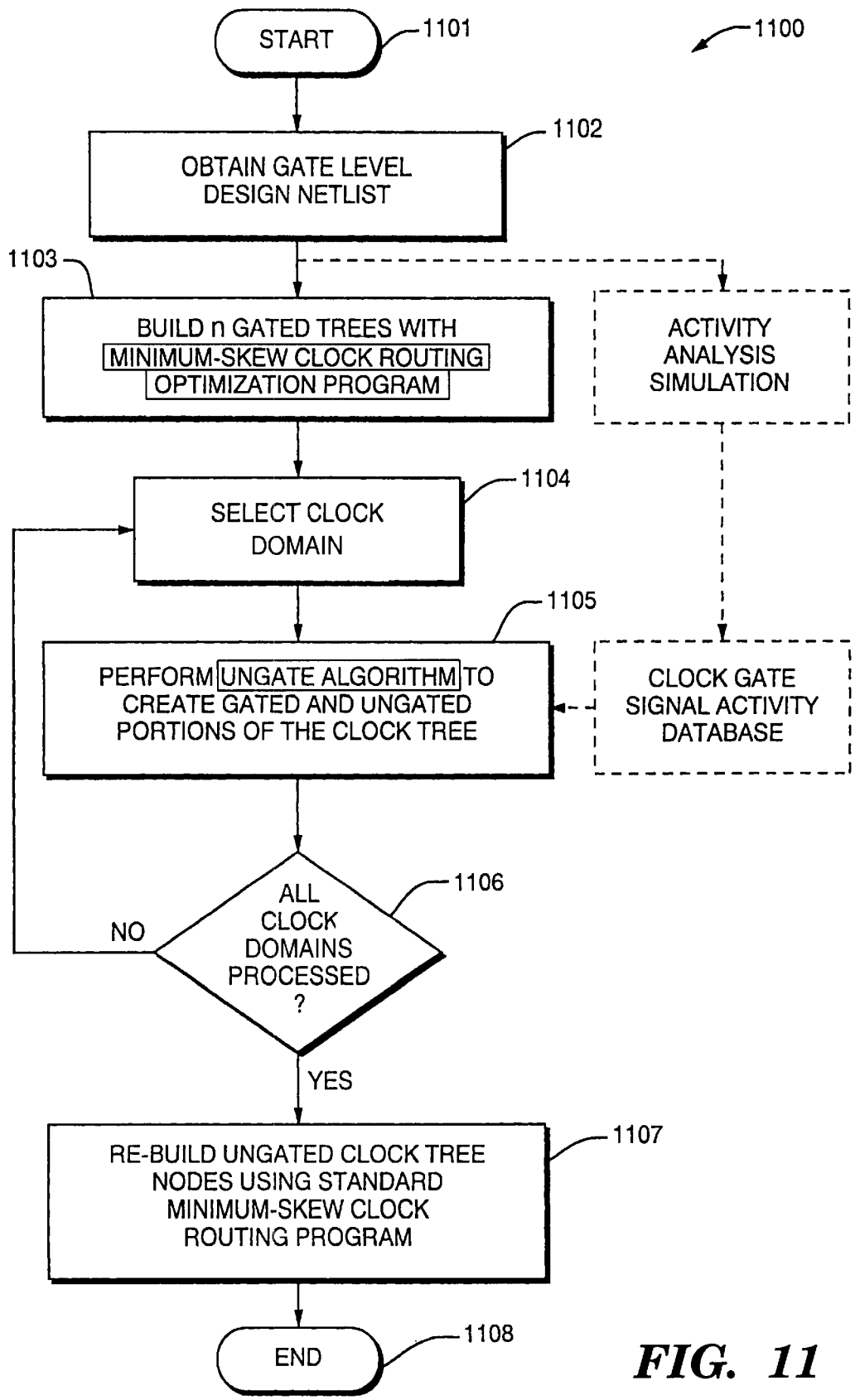
FIG. 11 is a flowchart of a physical design algorithm that operates in conjunction with the ungate algorithm of FIG. 10.

FIG. 11 is a flowchart of a physical design algorithm 1100 that operates in conjunction with the ungate algorithm 1000 of FIG. 10. The physical design algorithm 1100 performs a top-down analysis on a clock tree generated by the clock gating methodology 400 of FIG. 4 to decide whether to keep the clock gate domains defined therein based on power consumption considerations. The physical design algorithm 1100 begins in step 1101. In step 1102, the gate level design netlist for the gating optimized clock tree is obtained, and in step 1103 a minimumskew clock routing optimization program such as IBM's ClockDesigner tool is employed to generate n gated trees (e.g., one tree per gated domain) as is known in the art.

After the n gated trees have been generated, a clock gate domain within the clock tree is selected for analysis in step 1104. In step 1104, the ungate algorithm 1000 is performed on the selected clock gate domain. Note that to perform the ungate algorithm 1000 (e.g., the calculation of gated versus ungated power consumption), information regarding the activity analysis of the clock tree must be known. This information was generated during execution of the clock gating methodology 400 prior to the execution of the physical design algorithm 1100 (e.g., during an activity analysis simulation of the clock tree) and may be stored within a clock gating signal activity database (not shown) for use within the physical design algorithm 1100.

In step 1105, a determination is made as to whether all clock gate domains have been analyzed within the clock tree. If not, steps 1104 and 1105 are repeated for each clock gate domain within the clock tree; otherwise, in step 1107, ungated clock signals tree nodes (if any) are rebuilt for the clock tree design by employing a standard minimum-skew clock routing program (e.g., such as to generate the clock tree 901 of FIG. 9 from the clock tree 801 of FIG. 8a). In step 1108, the physical design algorithm 1100 ends.

A major advantage of the physical design algorithm 1000 is that the netlist fed to the clock routing program is designed with advanced knowledge of the physical structure of the clock tree design so that the netlist provides for efficient wiring even when clock gating is present. In this manner, low power consumption clock trees may be designed which balance efficient wiring with the power savings due to clock gating.

Figure 12:
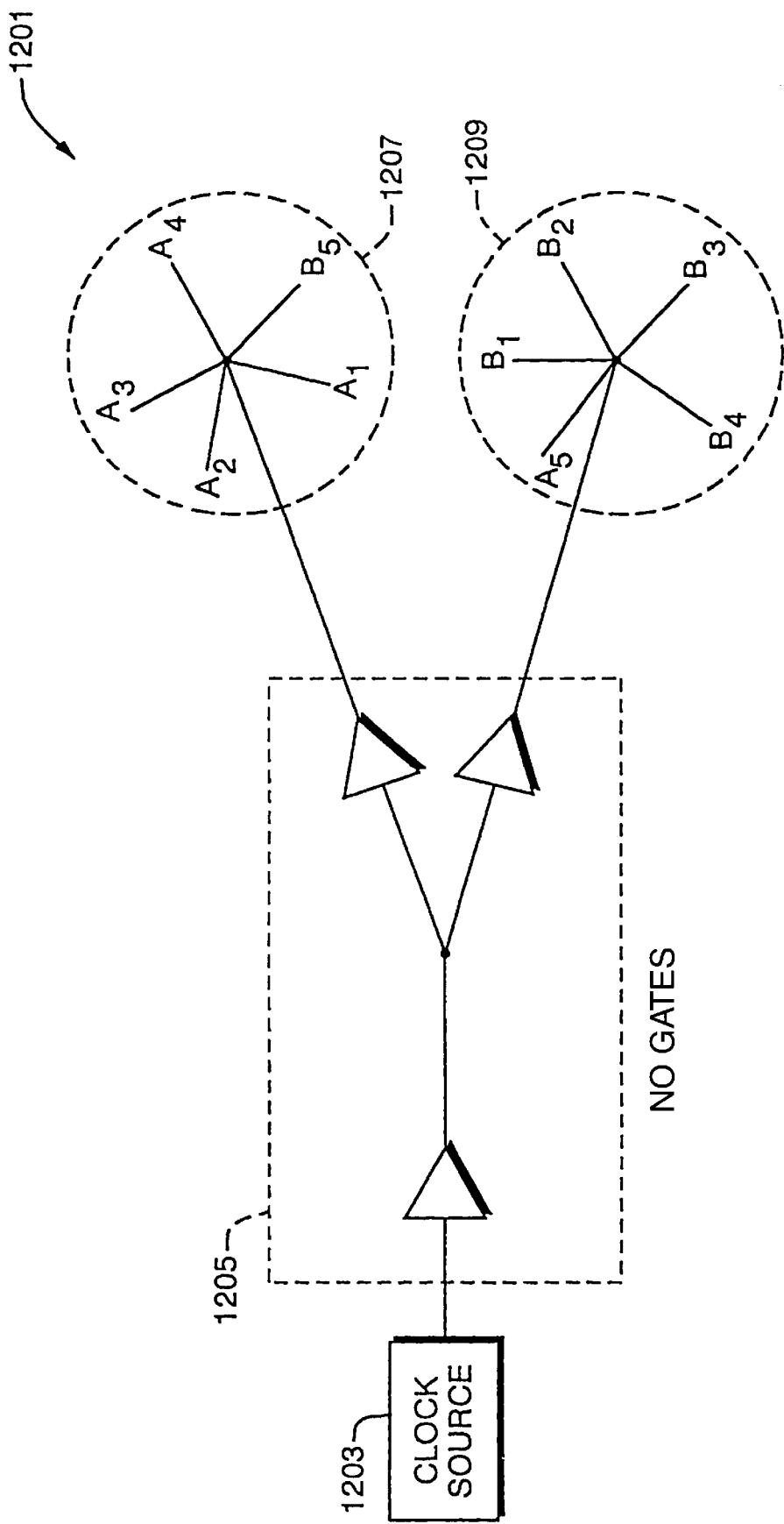
FIG. 12 is a schematic diagram of a minimum capacitance clock tree given heterogeneous clusters.

As an alternative to employing the clock gating methodology 400 of FIG. 4, a clock tree may be built using standard techniques to achieve a minimum capacitance tree which gathers closely adjacent sinks together into a logical network to be driven by a single buffer. For example, FIG. 12 is a schematic diagram of a minimum capacitance tree 1201 that comprises two sinks, sink A and sink B, fed by a clock source 1203 and by a repowering tree 1205. The sinks are contained within a first and a second sink cluster 1207, 1209 as shown.

The minimum capacitance tree 1201 was designed using standard minimum capacitance design techniques wherein no clock-gating knowledge is employed during the clock optimization stage. Accordingly, sinks of clock gate domain A and clock gate domain B are mixed together to minimize wiring lengths (e.g., sinks A1–A4 and sink B5 in cluster 1207 and sinks B1–B4 and sink A5 in cluster 1209). However, due to the intermixing of clock gate domains, clock gating of the upper levels of the tree is prevented. The minimum capacitance tree 1201, though optimized from a capacitance standpoint, is inefficient because it prevents clock gating within the root of the tree.

Figure 13:
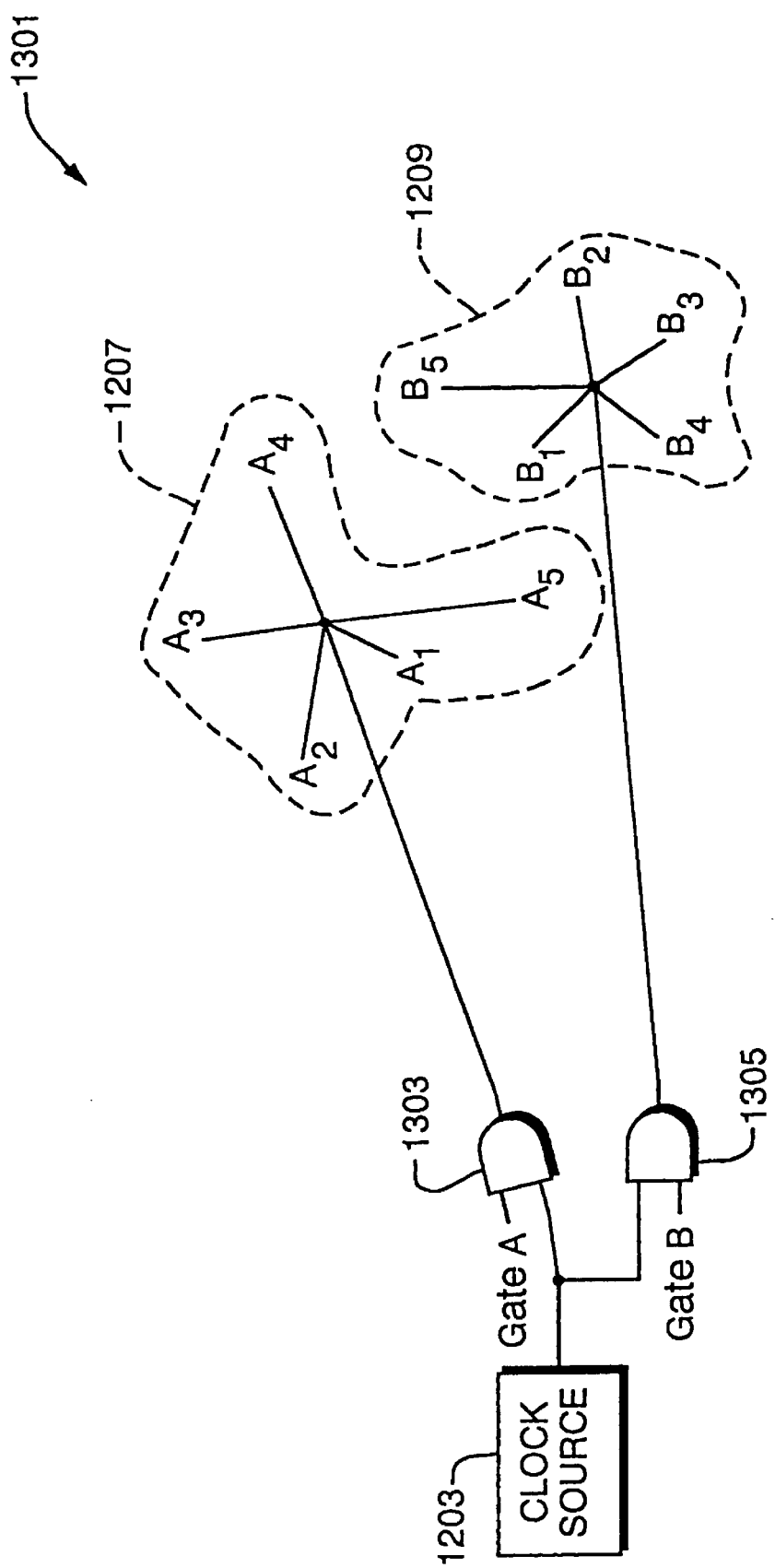
FIG. 13 is a schematic diagram of a clock tree, having clusters of sinks of each domain which may be produced in accordance with the present invention, that represents an improvement of the clock tree of FIG. 12.

FIG. 13 is a schematic diagram of a clock tree 1301 that represents an improvement of the clock tree 1201 of FIG. 12. The clock tree 1301 is generated by swapping sinks between clusters 1207 and 1209 to allow clock gating of each cluster. Specifically, sink A5 from the cluster 1209 becomes part of the cluster 1207 and sink B5 from the cluster 1207 becomes part of the cluster 1209. Because of the close proximity between the clusters 1207 and 1209, the "swapping" of sinks A5 and B5 can be performed without a significant increase in wiring length. "Swapping" in this context does not entail relocating (no changing the physical placement of) either sink on the semiconductor, but only a re-wiring such that the appropriate clock-gating signals are provided to each sink.

With the cluster 1207 modified to comprise only type A sinks, the cluster 1207 may be gated via gating logic 1303. Similarly, with the cluster 1209 modified to comprise only type B sinks, the cluster 1209 may be gated via gating logic 1305. In this manner, the clock tree 1301 comprises a near-minimum capacitance clock tree having additional power savings due to gating at the root of the tree. Sink swapping can be performed by a simple sink swapping algorithm described below with reference to FIG. 14.

Figure 14:
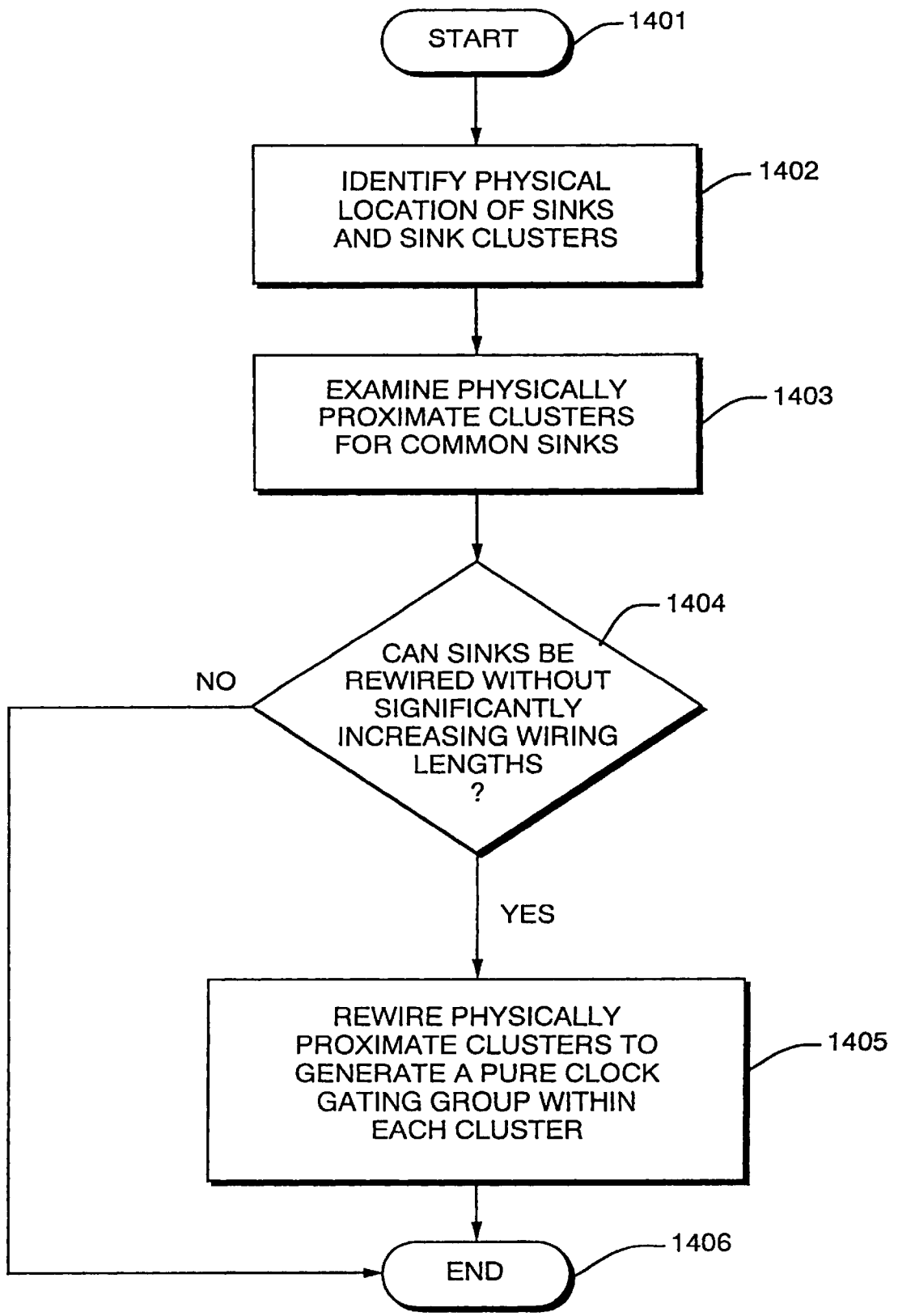
FIG. 14 is a flowchart of a sink swapping algorithm for swapping sinks between sink clusters within a minimum capacitance clock tree.

FIG. 14 is a flowchart of a sink swapping algorithm 1400 for swapping sinks between sink clusters within a minimum capacitance clock tree. The sink swapping algorithm 1400 starts in step 1401. In step 1402, the physical location of sinks and sink clusters within the clock tree are defined. Thereafter, in step 1403, physically proximate sink clusters (e.g., two clusters within a predetermined distance of each other) are examined for common sinks. In step 1404, a determination is made as to whether the sinks within the physically proximate clusters can be rewired without significantly increasing wiring lengths (e.g., without increasing capacitive power losses above a predetermined threshold). If so, in step 1405, the sinks within the physically proximate clusters are rewired to generate pure clock gate domains with each cluster (e.g., so that only sinks A are in cluster 1207 and only sinks B are in cluster 1209 of FIG. 13); and the swapping algorithm 1400 ends in step 1406. Otherwise, if in step 1404 it is determined that the sinks within the physically proximate clusters cannot be rewired without significantly increasing wiring lengths, the clusters are not rewired and the swapping algorithm 1400 ends in step 1406. Note that the swapping algorithm 1400 need not be employed only with minimum capacitance clock tree designs.

The clock gating methodology 400 of FIG. 4 as well as the ungate algorithm 1000 of FIG. 10, the physical design algorithm 1100 of FIG. 11 and the sink swapping algorithm 1400 of FIG. 14 are implementable in either hardware, software or a combination thereof. In software form, the methodology and algorithms may be programmed using any suitable programming language (e.g., C, C++, Pascal, assembly language and the like), and may be implemented as a computer program product carried by a medium readable by a computer (e.g., a carrier wave signal, a floppy disc, a hard drive, a random access memory, etc.).

The foregoing paragraphs adopted from the pending Patent Application of Dean et als., disclose only the preferred embodiments of the invention of Dean et als. Modifications of the above disclosed apparatus and methods of Dean et als which fall within the scope of the invention of Dean et als. will be readily apparent to those of ordinary skill in the art. For instance, the clock gating methodology 400, the ungate algorithm 1000, the physical design algorithm 1100 and the sink swapping algorithm 1400 may be performed manually or automatically and may be employed separately and/or individually.

The methods of Dean et als and other methods may operate during the inventive circuit placement process and/or they may be used after final logic circuit (e.g., sink) placement to reconfigure and further optimize the clock tree.

The methodologies and algorithms of the present invention, including an embodiment thereof depicted in FIG. 2b, are implementable in either hardware, software or a combination thereof. In software form, the methodology and algorithms may be programmed using any suitable programming language (e.g., C, C++, Pascal, assembly language and the like), and may be implemented as a computer program product carried by a medium readable by a computer (e.g., a carrier wave signal, a floppy disc, a hard drive, a random access memory, etc.). The foregoing description discloses only the preferred embodiments of the present invention. Modifications of the present inventive methods and apparatus disclosed above which fall within the scope of the present invention will be readily apparent to those of ordinary skill in the art. For instance, if a design has multiple independent clocks (i.e., clocks which are not generated by different gating functions from a single source clock) the inventive method can be applied independently or concurrently to each such independent clock. The method can also be applied hierarchically, performing all the specified steps for each separately placed hierarchical partition. Each of the steps may be performed manually or automatically and may be employed separately and/or individually.

Accordingly, while the present invention has been disclosed in connection with the preferred embodiments thereof, it should be understood that other embodiments may fall within the spirit and scope of the invention, as defined by the following claims.

Figure 15:
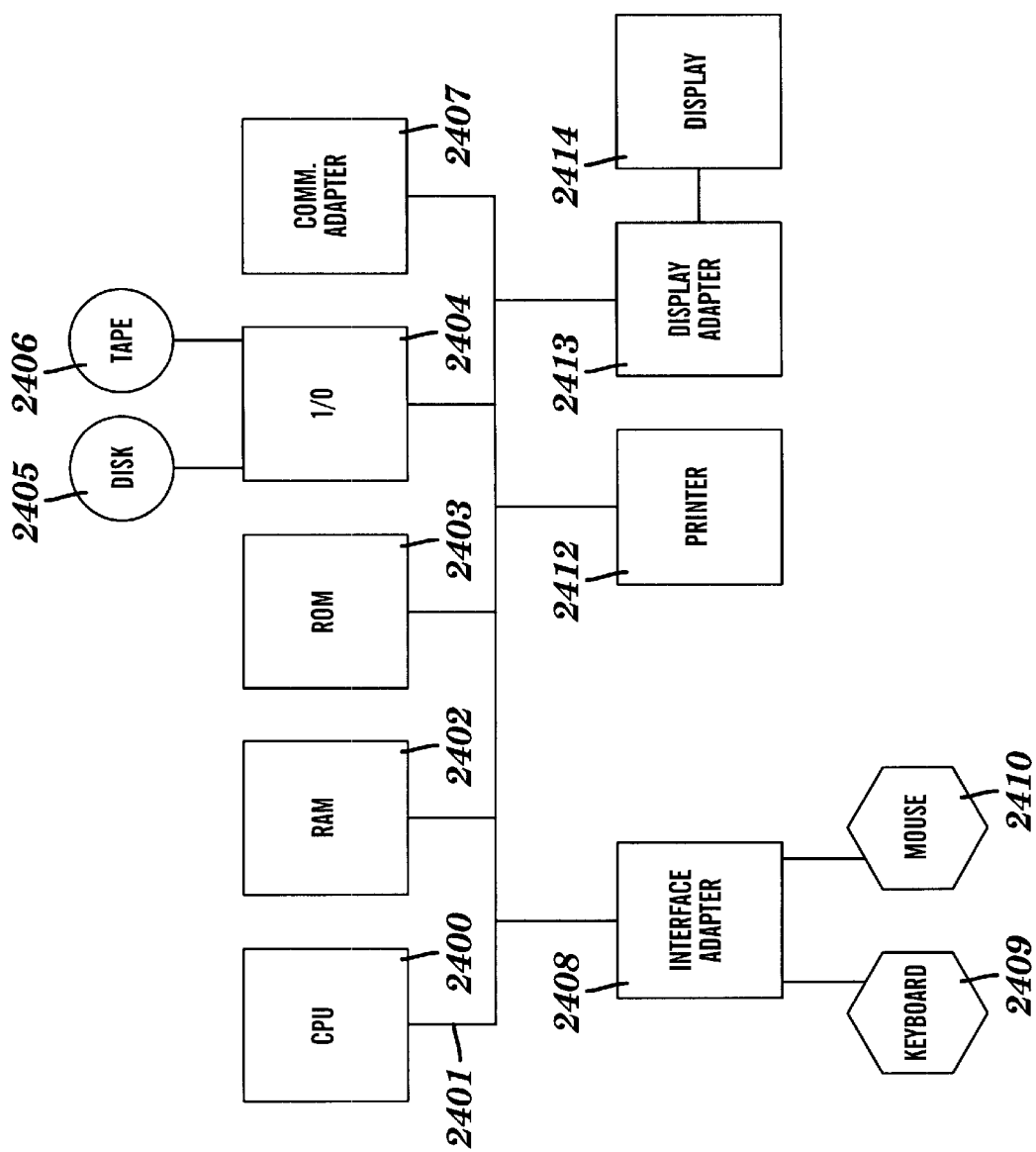
FIG. 15 is a hardware system for practicing this invention.

While the overall methodology of the invention is described above, the invention can be embodied in any number of different types of systems and executed in any number of different ways, as would be known by one ordinarily skilled in the art. For example, as illustrated in FIG. 15, a typical hardware configuration of an information handling/computer system in accordance with the invention preferably has at least one processor or central processing unit (CPU) 2400. For example, the central processing unit 2400 could include various image/texture processing units, mapping units, weighting units, adders, subtractors, comparators, etc. Alternatively, as would be known by one ordinarily skilled in the art given this disclosure, multiple specialized CPU=s (or other similar individual functional units) could perform the same processing, mapping, weighting, adding, subtracting, comparing, etc.

The CPU 2400 is interconnected via a system bus 2401 to a random access memory (RAM) 2402, read-only memory (ROM) 2403, input/output (I/O) adapter 2404 (for connecting peripheral devices such as disk units 2405 and tape drives 2406 to the bus 2401), communication adapter 2407 (for connecting an information handling system to a data processing network) user interface adapter 2408 (for connecting a peripherals 2409, 2410 such as a keyboard, mouse, microphone speaker and/or other user interface device to the bus 2401), a printer 2412, and display adapter 2413 (for connecting the bus 2401 to a display device 2414). The invention could be implemented using the structure shown in FIG. 15 by including the inventive method within a computer program stored on the storage device 2405. Such a computer program would act on information, such as the manufacturing variables supplied through the interface units 2409, 2410 or through the network connection 2407. The system would then automatically produce the parameterized parasitic values on the display 2414, through the printer 2412 or back to the network 2407.

I claim:

1. A method for synthesizing a logic circuit that is driven by a clock signal, and that has a plurality of clock domains each having a plurality of clock sinks, the method comprising:

providing a semiconductor substrate;

placing all of the plurality of clock sinks of one clock domain into at least one cluster of clock sinks on the semiconductor substrate, wherein a clock sink-density of each cluster of clock sinks is approximately equal to or greater than a clock sink density of an integrated circuit that includes the clock sinks of all of the clock domains, wherein a first portion of the plurality of clock sinks of a clock domain has a higher sink density than a second portion of the plurality of clock sinks of the same clock domain; wherein the first portion has a subregion and the second portion has a subregion, and wherein the subregion of the first portion is adjacent to the subregion of the second portion.

2. A method for synthesizing a logic circuit that is driven by a clock signal, and that has a plurality of clock domains each having a plurality of clock sinks, the method comprising:

providing a semiconductor substrate;

placing all of the plurality of clock sinks of one clock domain into at least one cluster of clock sinks on the semiconductor substrate, wherein a clock sink-density of each cluster of clock sinks is approximately equal to or greater than a clock sink density of an integrated circuit that includes the clock sinks of all of the clock domains, wherein a first portion of the plurality of clock sinks of a clock domain has a first region and a second portion of the plurality of clock sinks of the same clock domain has a second region, and wherein the first region is separated from the second region.

3. The method of claim 2 wherein the plurality of clock sinks of the first portion and the plurality of clock sinks of the second portion are gated by different physical clock gates.

4. The method of claim 2 wherein the plurality of clock sinks of the first portion are gated by a first clock gate controlled by a first clock gating signal, and the plurality clock sinks of the second portion are gated by a second clock gate controlled by a second clock gating signal.

5. The method of claim 4 wherein the second clock gating signal is a composite clock gating signal that logically includes the first clock gating signal.

6. The method of claim 2 wherein the plurality of clock sinks of the first portion are gated by a first clock gate controlled by a first clock gating signal, and the plurality of clock sinks of the second portion are ungated.

7. The method of claim 2 wherein there are no clock sinks of any other domain between the first region and the second region.

8. The method of claim 2 wherein there are no clock sinks of any other domain within the first region.

9. The method of claim 1 wherein at least one clock sink of another clustered domain is within the second region.

10. An integrated circuit that is driven by a clock signal, comprising:

a semiconductor substrate; and a plurality of clock domains each having a plurality of clock sinks;

wherein the plurality of clock sinks of one clock domain forms at least one cluster of clock sinks on the semiconductor substrate, wherein a clock sink-density of each cluster of clock sinks is approximately equal to or greater than a clock sink density of the integrated circuit that includes the clock sinks of all of the clock domains, wherein a first portion of the plurality of clock sinks of a clock domain has a higher sink density than a second portion of the plurality of clock sinks of the same clock domain; wherein the first portion has a subregion and the second portion has a subregion, and wherein the subregion of the first portion is adjacent to the region of the second portion.

11. A method for creating an integrated circuit having a clock signal distributed by a gated clock tree having a plurality of clock domains each having a plurality of clock sinks, comprising the steps of:

creating a model of the integrated circuit, wherein the model includes a netlist, and wherein the model of the integrated circuit includes a netlist of the gated clock tree;

changing the gated clock tree's netlist, wherein changing the gated clock tree's netlist includes placing a copy of a domain's gate at a level to implement single-gate gating of each separated subdomain;

establishing at least one target condition for a clock domain; and making a determination of the extent to which a clock domain is in compliance with the at least one target condition, wherein making a placement refinement is based upon the determination, and wherein a performance of the placement refinement divides a clock gate domain into a plurality of separated subdomains.

12. The method of claim 11 wherein the extent to which a domain is in compliance with a target condition is represented by a weighting factor.

13. The method of claim 12 further comprising changing the weighting factor of the target condition so that the target condition will have no influence upon a subsequent placement refinement.

14. The method of claim 12 wherein the weighting factor applies to the connections between the clock sinks of the domain.

15. The method of claim 12 wherein the weighting factor applies to the clock sinks of the domain.

16. The method of claim 12 wherein the weighting factor is implemented by a numerical value.

17. The method of claim 12 wherein the weighting factor is implemented by modifying a netlist to change an influence of a particular connection.

18. The method of claim 11 wherein the step of making a placement refinement results in an increase of the extent of the domain's compliance with the target condition.

19. The method of claim 11 wherein the placement refinement provides real placement information.

20. The method of claim 19 wherein the determination of the extent to which a domain is in compliance with the target condition is based upon information provided by a performance of the placement refinement step.

21. The method of claim 11 wherein the placement refinement is a partitioning min-cut.

22. The method of claim 21 wherein performance of the placement refinement step places all clock sinks of a given clock gate domain together in one region in compliance with the target condition, wherein the wherein the target condition is a minimum sink density.

23. The method of claim 11 wherein the netlist includes:
a connection between a clock signal and at least one clock sink of a clock domain.

24. The method of claim 11 wherein the steps of making a determination and of making a placement refinement are repeated.

25. The method of claim 11 wherein a target condition includes at least one of:
a minimum target sink density;
a maximum target sink density;
a maximum domain switching capacitance;
a maximum overlap of sub/domain regions;
a minimum overlap of sub/domain regions;
a limitation on crossing of clock signal wires;
a maximum of heat release per unit area; and
a maximum of heat release per unit area per unit time; and
a range of heat-release per unit area per unit time.

26. The method of claim 25 wherein a target condition is a target sink density, and wherein the determination of the extent to which clock domain is in compliance with the target condition includes calculating the density of sinks in a clock domain and comparing the calculated density to the target sink density.

27. The method of claim 26 wherein the target condition is a minimum sink density, and wherein the minimum sink density is approximately equal to or greater than a clock sink density of the integrated circuit.

28. A method for creating an integrated circuit, comprising the steps of:
providing a semiconductor substrate;
providing a logic circuit design;
providing a clock tree design having clock sinks in common with the logic circuit design;
performing a placement refinement providing information about a location of the clock sinks on the substrate; and
performing an after-placement-type clock tree optimization method before placement is complete, wherein the after-placement-type clock tree optimization method comprises the steps of:
determining a correlation level between a plurality of clock gating signals and their corresponding gates which gate a source clock; and
combining a single clock gating signal and a single corresponding gate said plurality of clock gating signals and their corresponding gates only if the correlation level determined by the determining step falls within preselected range of levels of correlation.

29. A computer program product for use in designing an integrated circuit having a clock signal distributed by a gated clock tree having a plurality of clock domains each having a plurality of clock sinks, the computer program product comprising a medium readable by a computer, the computer readable medium having:
program code for creating a model of the integrated circuit, wherein the model includes a netlist, and wherein the model of the integrated circuit includes a netlist of the gated clock tree;
program code for changing the gated clock tree's netlist, wherein changing the gated clock tree's netlist includes placing a copy of a domain's gate at a level to implement single-gate gating of each separated subdomain;
program code for establishing at least one target condition for a clock domain;
program code for making a determination of the extent to which a clock domain is in compliance with the at least one target condition; and
program code for making a placement refinement based upon the determination, wherein
a performance of the placement refinement divides a clock gate domain into a plurality of separated subdomains.

* * * * *